(12) United States Patent
Heikkinen et al.

(10) Patent No.: US 12,096,562 B2
(45) Date of Patent: Sep. 17, 2024

(54) INTERFACE ASSEMBLY AND METHOD FOR MANUFACTURING INTERFACE ASSEMBLY

(71) Applicant: TactoTek Oy, Oulunsalo (FI)

(72) Inventors: Mikko Heikkinen, Oulunsalo (FI); Jarmo Sääski, Oulunsalo (FI); Ilpo Hänninen, Oulunsalo (FI); Antti Keränen, Oulunsalo (FI); Tomi Simula, Oulunsalo (FI); Vinski Bräysy, Oulunsalo (FI); Pälvi Apilo, Oulunsalo (FI); Pasi Korhonen, Oulunsalo (FI); Topi Wuori, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 18/644,647

(22) Filed: Apr. 24, 2024

(65) Prior Publication Data

US 2024/0284598 A1    Aug. 22, 2024

Related U.S. Application Data

(62) Division of application No. 18/104,479, filed on Feb. 1, 2023, now Pat. No. 12,004,299.

(51) Int. Cl.
*H05K 1/02* (2006.01)
*B29C 51/14* (2006.01)
(Continued)

(52) U.S. Cl.
CPC ............. *H05K 1/185* (2013.01); *B29C 51/14* (2013.01); *G01P 1/02* (2013.01); *H05K 3/0014* (2013.01);
(Continued)

(58) Field of Classification Search
CPC ........ H05K 1/02; H05K 1/185; H05K 3/0014; H05K 3/306; H05K 2201/10151;
(Continued)

(56) References Cited

U.S. PATENT DOCUMENTS

| 5,659,246 A | 8/1997 | Togo et al. |
| 5,864,192 A | 1/1999 | Nagate et al. |

(Continued)

FOREIGN PATENT DOCUMENTS

WO    2006036950 A1    4/2006

OTHER PUBLICATIONS

International Search Report dated Apr. 26, 2024, issued in corresponding international application No. PCT/FI2024/050035, 5 pages.

(Continued)

*Primary Examiner* — Xiaoliang Chen
(74) *Attorney, Agent, or Firm* — Robert P. Michal, Esq.; Carter, DeLuca & Farrell LLP

(57) ABSTRACT

An interface assembly includes a functional multilayer structure that includes a first substrate a molded material layer on a first side of the first substrate, and a sensor arrangement including at least one sensor, wherein the sensor arrangement is arranged at least partly embedded into the molded material layer. The assembly further includes a movable member being movable relative to the functional multilayer structure, wherein the movable member includes at least one detection portion, and the sensor arrangement and the at least one detection portion are mutually arranged so that a position or a change of position of the movable member is detectable by the sensor arrangement based on a position or a change of position of the at least one detection portion relative to the sensor arrangement.

5 Claims, 12 Drawing Sheets

(51) Int. Cl.
  *G01P 1/02* (2006.01)
  *H05K 1/18* (2006.01)
  *H05K 3/00* (2006.01)
  *H05K 3/14* (2006.01)
  *H05K 3/30* (2006.01)
  *B29L 31/34* (2006.01)

(52) U.S. Cl.
  CPC ...... *H05K 3/306* (2013.01); *B29L 2031/3425* (2013.01); *H05K 2201/10151* (2013.01); *H05K 2201/10265* (2013.01); *H05K 2203/1327* (2013.01); *H05K 2203/166* (2013.01)

(58) Field of Classification Search
  CPC ... H05K 2201/10265; H05K 2203/166; H05K 2203/1327; B29L 51/14; B29L 203/3425; G01P 1/02; G01D 5/145; G01D 5/2451
  USPC ....... 361/752; 324/174, 207.11, 207.25, 247, 324/661; 384/448
  See application file for complete search history.

(56) References Cited

U.S. PATENT DOCUMENTS

| | | |
|---|---|---|
| 10,194,526 B1 | 1/2019 | Simula et al. |
| 10,852,431 B1 | 12/2020 | Duan |
| 2001/0022350 A1 | 9/2001 | Ito |
| 2003/0057392 A1 | 3/2003 | Ito |
| 2005/0089253 A1 | 4/2005 | Koike et al. |
| 2008/0012555 A1 | 1/2008 | Ikeda |
| 2009/0206827 A1 | 8/2009 | Aimuta et al. |
| 2010/0231212 A1* | 9/2010 | Yamamoto ............. G01D 5/145 324/247 |
| 2010/0253653 A1 | 10/2010 | Stambaugh et al. |
| 2011/0102606 A1 | 5/2011 | Toyomura et al. |
| 2011/0254543 A1* | 10/2011 | Frachon ................ G01D 5/145 324/207.25 |
| 2012/0160748 A1 | 6/2012 | Grim et al. |
| 2013/0080099 A1 | 3/2013 | Akada |
| 2013/0121629 A1 | 5/2013 | Takada et al. |
| 2015/0097560 A1* | 4/2015 | Kawakami ............ G01R 33/09 324/252 |
| 2016/0098016 A1 | 4/2016 | Ely et al. |
| 2016/0285331 A1 | 9/2016 | Ichikawa et al. |
| 2016/0306062 A1 | 10/2016 | Keene et al. |
| 2019/0027980 A1 | 1/2019 | Shimokawa et al. |
| 2019/0364663 A1* | 11/2019 | Yosui .................... H05K 1/115 |
| 2022/0195760 A1 | 6/2022 | Mensch et al. |
| 2023/0171304 A1 | 6/2023 | Shelton, IV et al. |
| 2023/0184089 A1 | 6/2023 | Treiberg et al. |

OTHER PUBLICATIONS

Written Opinion of the International Searching Authority dated Apr. 26, 2024, issued in corresponding international application No. PCT/FI2024/050035, 7 pages.

Office Action issued by the USPTO in relation to U.S. Appl. No. 18/104,479 dated Aug. 23, 2023 (15 pages).

Office Action issued by the USPTO in relation to U.S. Appl. No. 18/104,479 dated Oct. 13, 2023 (15 pages).

* cited by examiner

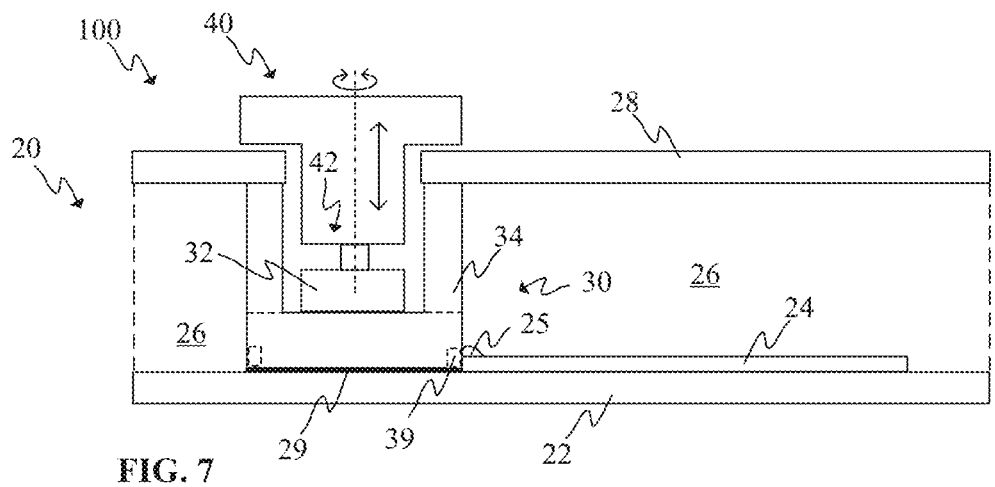
FIG. 7
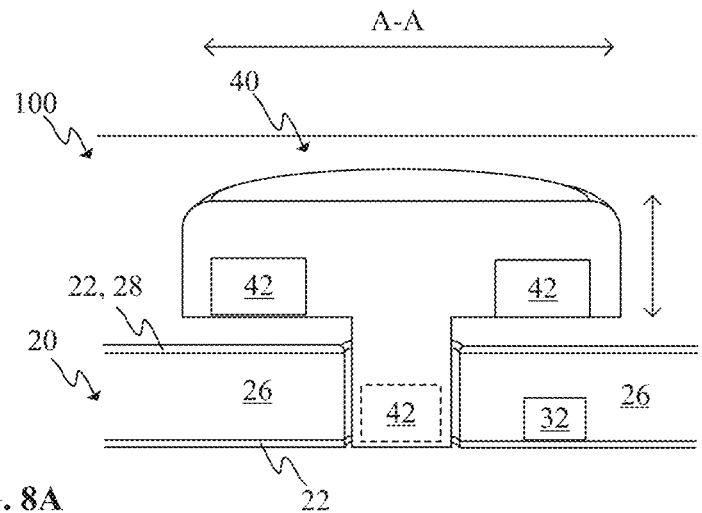
FIG. 8A
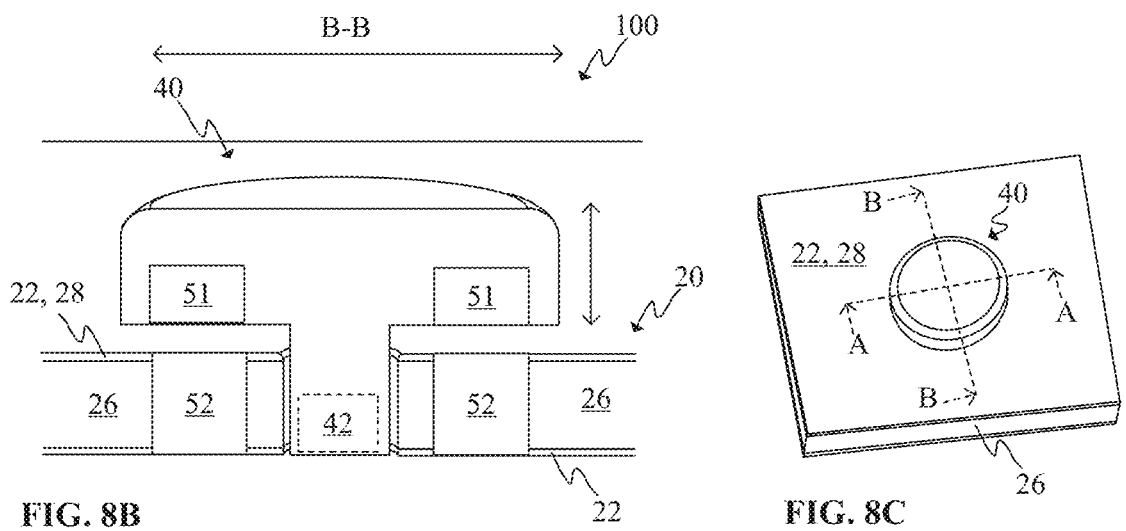
FIG. 8B
FIG. 8C

INTERFACE ASSEMBLY AND METHOD FOR MANUFACTURING INTERFACE ASSEMBLY

CROSS-REFERENCE TO RELATED APPLICATIONS

This application is a divisional of U.S. patent application Ser. No. 18/104,479 filed Feb. 1, 2023, the disclosure of this application is expressly incorporated herein by reference in its entirety.

TECHNICAL FIELD

The present invention relates in general to functional, integrated structures, such as electronic (multilayer) assemblies, and methods for manufacturing thereof. In particular, however not exclusively, the present invention concerns interface assemblies and methods for manufacturing an interface assembly including, for example, electronics and a molded, optionally injection molded, material layer, such as of plastic material.

BACKGROUND

There exists a variety of different stacked assemblies and structures in the context of electronics and electronic products. The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antenna, labels, vehicle electronics, etc.

Electronics such as electronic components (passive or active components), ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or, generally, the design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment.

In typical solutions, electrical circuits have been produced on a printed circuit board (PCB) or a on substrate film, after which they have been overmolded by plastic material. Known structures and methods have, however, some drawbacks, still depending on the associated use scenario. In order to produce an electronic assembly having one or more functionalities, typically rather complex electrical circuits for achieving these functionalities have to be produced on a substrate by printing and/or utilizing SMDs, and then be overmolded by plastic material. Accordingly, both direct provision of functional or specifically electrical elements such as related components on a larger host substrate and preparation of collective subassemblies upfront for subsequent mounting thereon have their own downsides in terms of electronics vulnerability, structural and installation complexity as well as thermal management, for example, whereupon there remains room for improvement in terms of related improved or alternative manufacturing techniques and resulting end structures.

Especially, problematic can be structures having movable elements, such as in case of interface devices. For example, overmolding a knob or a button or other (user) interface element would make it useless since the molding material would eventually solidify and fix the interface element into its place. On the other hand, it would be desirable to use IMSE structures to provide interfaces for a user to control the overall structure and/or the host device. These has been in many cases implemented by passive sensing elements, such as based on capacitive sensing, in which case there is no need for the sensing element to be able to move when being used. However, many times it would be advantageous to provide feedback to the user in the way that he or she feels the interface element, such as a button, moving when being touched and operated. There is thus still need to develop structures and methods related both to IMSE technology and integrated electronics in general and especially related to interface assemblies used therein.

SUMMARY

The objective of the present invention is to at least alleviate one or more of the above drawbacks associated with the known solutions in the context of integral structures including functional elements such as electronics and utilizing molded or cast material layers or structures. Another objective is to provide interface durable assemblies having high level of integration and which are adaptable to different use cases, and methods to facilitate manufacturing thereof efficiently.

The objectives of the invention are reached by an interface assembly and a method for manufacturing an interface assembly as defined by the respective independent claims.

According to a first aspect, an interface assembly is provided. The interface assembly comprises a functional multilayer structure and a movable member being movable relative to the functional multilayer structure.

The functional multilayer structure comprises a first substrate, a molded material layer on a first side of the first substrate, and a sensor arrangement comprising at least one sensor, wherein the sensor arrangement is arranged at least partly embedded into the molded material layer.

The movable member comprises at least one detection portion, however, in many cases, several such portions.

Furthermore, the sensor arrangement and the at least one detection portion, or portions, are mutually arranged so that a position or a change of position (e.g., optionally, speed, acceleration, jerk, and also direction of speed, acceleration, jerk) of the movable member is detectable by the sensor arrangement based on a position or a change of position of the at least one detection portion relative to the sensor arrangement.

In some embodiments, the movable member and the functional multilayer structure may be attached to each other in a movable manner. Thus, the movable member and the functional multilayer structure may, preferably, not be completely separate and freely movable relative to each other, but there is at least some attachment feature, such as a force, element and/or structure preventing or at least resisting these two becoming detached from each other completely, when being in attachment to each other by the attachment feature. In many cases, the attachment feature may limit, but not necessarily completely prevent, movement of the movable member relative to the functional multilayer structure in one, several, or all directions, or rotation of the member around an axis of rotation, or at least resist the movement in said direction(s). The attachment feature may be arranged so that the movable member can move without resisting or limitations by the attachment feature within some limits in one or several directions, however, beyond said limits the attachment feature resists or even prevents, such as mechanically blocks, the movement.

In some embodiments, the attachment in movable manner includes a magnetic attachment arrangement comprising a first attachment portion on the functional multilayer structure and a second attachment portion on the movable member, wherein the magnetic attachment arrangement is arranged to exert an attractive magnetic force between the first and second attachment portions. This may be regarded as the attachment feature resisting the detachment.

Alternatively or in addition, the attachment in movable manner may include a mechanical attachment arrangement, the mechanical attachment arrangement being arranged to prevent or at least hinder or resist detachment of the movable member with respect to the functional multilayer structure. For example, the mechanical attachment arrangement may comprise a frame adapted to at least partly confine the movable member between the frame and the functional multilayer structure so that the movable member is movable in a space between the frame and the functional multilayer structure.

In various embodiments, the functional multilayer structure may comprise a groove, a hole, or a through-hole, and a part of the movable member comprising the at least one detection portion may be adapted to extend into and arranged movable in the groove, the hole, or the through-hole. Furthermore, optionally, the interface assembly may comprise a shape interlocking arrangement between a portion of the groove, the hole, or the through-hole, and the movable member so as to prevent or at least hinder or resist detachment of the movable member with respect to the functional multilayer structure. The groove or the hole may, for example, define a concave shape into the multilayer structure.

In some embodiments, the movable member may be movable in a translational manner, such as linearly or non-linearly, relative to the functional multilayer structure, optionally in the groove, the hole, or the through-hole.

Alternatively or in addition, the movable member may be movable in a rotational manner relative to the functional multilayer structure, optionally in the groove, the hole, or the through-hole.

In some embodiments, the functional multilayer structure may comprise a protrusion, a pin, or other shape which extends outward from a surface of the multilayer structure, and the movable member may be movable relative to, such as rotatable around, the protrusion, the pin, or said other shape. The protrusion, the pin, or said other shape may, for example, define a convex shape, dome-like shape, out of the multilayer structure.

Furthermore, the at least one sensor may be at least one optical sensor arranged to transmit an optical detection signal for detecting the position or the change of position of the at least one detection portion.

In some embodiments, the at least one detection portion may comprise one or several magnets and/or ferromagnetic elements, and the sensor arrangement comprises a magnetometer, such as comprising a coil, or a Hall effect sensor for detecting position or a change of position of the one or several magnets.

Alternatively or in addition, the sensor arrangement may comprise a capacitive sensing element for detecting the position or the change of position of the at least one detection portion.

In some embodiments, rotational movement of the movable member may be detected by the magnetometer or Hall effect sensor, and linear movement thereof with capacitive sensing element, or vice versa.

Furthermore, the movable member may be mechanically coupled to the functional multilayer structure via a spring. In some embodiments, a center portion of the spring may comprise a through-hole through which the movable member extends towards the functional multilayer structure. Alternatively to the through-hole or in addition, the spring may have a shape of a segmental dome, wherein, when the spring is not completely compressed, an edge portion or portions of the segmental dome are in contact with one of the functional multilayer structure and the movable member, and a center portion of the segmental dome is spaced apart from the other of the functional multilayer structure and the movable member.

In some embodiments, the spring may be a planar spring, such as an ortho-planar spring. Optionally, the spring may be of plastic material, such as of a thermoformable plastic film.

In various embodiments, the movable member may be attached and arranged to move in a hinged manner relative to the functional multilayer structure. For example, the movable member may be attached from one end thereof to the functional multilayer structure by a hinge mechanism.

The sensor arrangement may comprise a plurality of sensors including at least two different types of sensors for detecting the position or the change of position of the at least one detection portion, the types of sensors being selected from the group consisting of: optical, capacitive, inductive, resistive, magnet, galvanic, audio, or any combination thereof.

In various embodiments, the interface assembly may comprise a second substrate on the opposite side of the molded material layer relative to the first substrate.

The sensor arrangement may be provided onto a surface of the first substrate and/or the second substrate.

One of the first substrate or the second substrate, or both of them, may be thermoformable substrate films, optionally having a non-planar, three-dimensional shape, at least locally.

According to a second aspect, a method for manufacturing an interface assembly is provided. The method comprising obtaining or producing a first substrate, such as a thermoformable substrate film, and obtaining at least one sensor configured to detect position or a change of position of at least one detection portion. The method further comprises molding material on one side of the first substrate to at least partly embed a sensor arrangement including the at least one sensor into a molded material layer, thereby obtaining a functional multilayer structure. The method also comprises obtaining or producing a movable member comprising the at least one detection portion, and mutually arranging the sensor arrangement and the at least one detection portion so that position or a change of position of the movable member is detectable by the sensor arrangement based on position or a change of position of the at least one detection portion relative to the sensor arrangement.

In various embodiments, the method comprises thermoforming the first substrate to have at least a portion with a non-planar 3D shape prior the molding. In some embodiments, the thermoforming may include stretching the first substrate at least locally under elevated pressure to produce the non-planar 3D shape.

Furthermore, the method may comprise providing a groove, a hole, or a through-hole; or a protrusion, a pin or other shape extending outwards from a surface of the functional multilayer structure during the thermoforming.

Furthermore, in addition or alternatively, the method may comprise attaching the movable member and the functional multilayer structure to each other in a movable manner.

The present invention provides interface assemblies and methods of manufacture of an interface assembly. The present invention provides advantages over known solutions that robust interface assemblies can be produced in which the movable members, such as buttons or switches, provide tactile feedback to the user when the member moves. Furthermore, the interface assembly can be made durable, both with respect to the movable member but also the functional multilayer structure, by embedding the sensor arrangement in the material layer which is provided by molding, such as injection molding. The result structure is both structurally durable and simple, as well as saves material, and also functionally robust or stable. In various embodiments, the movable member can be made substantially passive, thus provide very robust and durable device.

Various other advantages will become clear to a skilled person based on the following detailed description.

The expression "a number of" may herein refer to any positive integer starting from one (1), that is being one, at least one, or several.

The expression "a plurality of" may refer to any positive integer starting from two (2), that is being two, at least two, or any integer higher than two.

The terms "first", "second" etc. are herein used to distinguish one element from other element, and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also unrecited features. The features recited in the dependent claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF THE DRAWINGS

Next the invention will be described in greater detail with reference to exemplary embodiments in accordance with the accompanying drawings, in which:

FIG. 7 illustrates an interface assembly;
FIGS. 8A, 8B and 8C illustrate an interface assembly.

DETAILED DESCRIPTION

Figure 1:
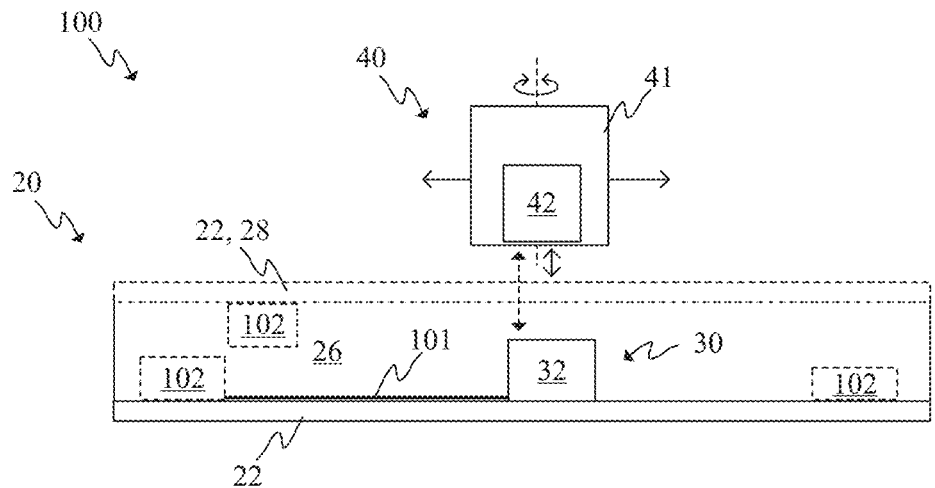
FIG. 1 illustrates an interface assembly.

In respective figures, the same or corresponding parts are denoted by the same reference numerals, and in most cases duplicate textual description will be omitted as well.

In accordance with numerous embodiments described herein, an interface assembly is provided. The interface assembly comprises a functional multilayer structure. The functional multilayer structure comprises a first substrate, such as a substrate film (of plastic, for instance), a molded material layer on a first side of the first substrate, and a sensor arrangement comprising at least one sensor, wherein the sensor arrangement is arranged at least partly embedded into the molded material layer. Furthermore, the interface assembly, preferably, comprises a movable member being movable relative to the functional multilayer structure, wherein the movable member comprises at least one detection portion. The sensor arrangement and the at least one detection portion are mutually arranged or at least arrangeable, such as mutually structurally adapted, so that a position or a change of position of the movable member is detectable by the sensor arrangement based on a position or a change of position of the at least one detection portion relative to the sensor arrangement.

The substrate, such as a substrate film, may, preferably, be of thermoformable material, however, not necessarily. In case the substrate is of thermoformable material, the substrate can be thermoformed to have a different shape than it originally had. For example, a planar substrate or substrate film (which is considered to be planar also if flexible and being on a roll but unrolled from the roll to define a piece of film that has a planar or "two-dimensional" shape). Thus, the substrate can be thermoformed to other than planar shape, such as to comprise at least locally one shape having dimensions in all three dimensions, thus making the substrate non-planar.

The thermoforming, which may be performed under at least elevator pressure and optionally also under elevator temperature, may have been performed to the substrate prior to or after providing conductive traces on the substrate. The temperature may be such as heating the substrate to a temperature at which the substrate (film) does not melt but softens so that it is formable without breaking the substrate. For example, for plastic materials, this may be called the glass transition temperature.

Alternatively or in addition, the thermoforming may have been performed prior to or, preferably, after providing a portion of the sensor arrangement and/or electronic components on the substrate, if any. Thus, the substrate may be thermoformed after providing conductive traces but prior to providing the portion of the sensor arrangement and/or electronics components on the substrate, for instance. In other examples, the substrate may be thermoformed prior to providing the traces, sensor(s) and electronic components. Alternatively, the substrate may be thermoformed after providing the traces, sensor(s) and electronic components.

Thermoforming the substrate herein refers to techniques in which an existing substrate, typically having significantly larger dimensions in two lateral directions being at least locally perpendicular relative to its thickness direction of the substrate, is being shaped from one shape to another, at least locally. Thus, thermoforming the substrate as referred to herein does not mean producing a substrate (planar or non-planar) from material in liquid or liquid-like state and then providing it into a mold and waiting for it to solidify, such as is done in casting or molding.

In various embodiments, the molded material layer may have been molded, such as injection molded, on a first side of the substrate after providing conductive traces, if any, and the portion of the sensor arrangement (at least one sensor) on the substrate, thereby at least partly embedding or covering them into the molded material layer. The thermoforming is, preferably, performed prior to or simultaneously with the provision of the molded material layer. Naturally, the substrate may be post-processed, such as cut, drilled, polished, varnished, etc. after being provided with the sensor arrangement, if any.

In various embodiments, the substrate(s) may be a substrate film(s), for example, of flexible and 3D-formable (3D-shapeable) material, such as thermoformable (plastic) material. As being easily comprehended by a person skilled in the art, instead of a single, optionally monolithic film, the substrate (film) could be of a multi-layer and/or multi-section construction with mutually different layers at least in places, for instance. There may be further substrate(s) (films) in the structure as well.

The substrate film and/or further substrate film(s) or generally material layer(s) included in the multilayer structure may comprise at least one material selected from the group consisting of: polymer, thermoplastic material, electrically insulating material, Polymethyl methacrylate (PMMA), Poly Carbonate (PC), flame retardant (FR) PC film, FR700 type PC, copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

The thickness of the substrate film and optionally of further film(s) or layer(s) may vary depending on the embodiment; it may only be of few tens or hundreds of a millimeter, or considerably thicker, in the magnitude of one or few millimeter(s), for example.

The thickness of the molded material layer may also be selected case-specifically but thicknesses of few millimeters, such as about 3-5 millimeters, may be applied. In some embodiments, only about 2 millimeter thickness could be sufficient if not optimum, while in some other embodiments the thickness could be considerably more as well, e.g. about 1 cm or more at least in places. The thickness may indeed locally vary. The molded material layer may optionally comprise recesses or internal cavities for light guiding, processing, and/or thermal management purposes, for instance, in addition to accommodating various elements such as electronic or optical elements.

FIG. 1 illustrates schematically an interface assembly 100 in accordance with some embodiments. As can be seen, the assembly 100 comprises a functional multilayer structure 20. The functional multilayer structure 20 comprises at least one substrate 22, 28, such as a substrate film, optionally being flexible and/or thermoformable. Furthermore, the assembly 100 comprises a sensor arrangement 30 comprising at least one sensor 32, wherein the sensor arrangement 30 is arranged at least partly embedded into the molded material layer 26, such as injection molded plastic material layer. Still further, the interface assembly 100 may comprise a movable member 40 being movable relative to the functional multilayer structure 20, wherein the movable member 40 comprises at least one detection portion 42. The movable member 40 may, preferably, comprise a body 41 or a frame portion 41.

As illustrated by the solid arrows in FIG. 1, the movable member 40 may be movable in a translational manner, such as linearly or non-linearly, relative to the functional multilayer structure 20. The multilayer structure 20 may, optionally, comprise a groove, a hole, or a through-hole, or the like, in which the movable member 40 or at least the detection portion 42 thereof is adapted to be moved. Alternatively, the multilayer structure 20 may, optionally, comprise a protrusion, a pin, or other shape which extends outward from the surface of the multilayer structure 20. The movable member 40 may then comprise a groove, a hole, or a through-hole, or the like into which the protrusion, the pin, or said other shape can extend into.

Alternatively or in addition, the movable member 40 may be movable in a rotational manner relative to the functional multilayer structure 20. One option is illustrated in FIG. 1, that is the axis of rotation is approximately perpendicular relative to a lateral direction of the functional multilayer structure 20. Said movement may also occur in a groove, a hole, or a through-hole of the functional multilayer structure 20, or around a protrusion, a pin, or other shape extending outward from the surface of the multilayer structure.

Regarding the sensor arrangement 30, the sensor(s) 32 may be arranged onto (a surface of) the at least one substrate 22, 28, however, not necessarily. The sensor(s) 32 may be arranged also within the molded material layer 26 and spaced apart from the at least one substrate 22, 28. In some embodiments, the arrangement 30 may comprise in addition to the at least one (or a plurality of) sensor(s) 32, a body or a frame inside of which the sensor 32 resides, although not shown in, for example, FIGS. 1-3.

Furthermore, in some embodiments, including a plurality of sensors 32 in the arrangement 30, some of the sensors 32 may be arranged onto (a surface of) the at least one substrate 22, 28, whereas some other ones of the sensors 32 are spaced apart from the at least one substrate 22, 28. In some cases, some of the sensors 32 may even be completely outside the molded material layer 26. In an embodiment, one sensor 32 may be on one substrate 22 while another sensor may be on another substrate 28, preferably arranged on opposite sides of the molded material layer 26.

Still further, in various embodiments, the movable member 40 and the functional multilayer structure 20 may be attached to each other in a movable manner. This is illustrated schematically by the longer two-headed vertical arrow extending through the substrate 22, 28 above the molded material layer 26, drawn with a dashed line in FIG. 1.

Thus, the movable member 40 and the functional multilayer structure 20 may, preferably, not be completely separate and freely movable relative to each other limitlessly, but there may be at least some attachment feature, such as a force, element and/or structure preventing or at least resisting these two becoming detached from each other completely, when being in attachment to each other by the attachment feature. In many cases, the attachment feature may limit movement of the movable member 40 relative to the functional multilayer structure 20 in one, several or all directions, or at least resist the movement in said direction(s). The movement between said two entities may be more or less free within the range of 0-10 centimeters, for instance, however it depends on the embodiment. The attachment feature may be arranged so that the movable member 40 can move without resisting or limitations by the attachment feature within some limits in one or several directions, however, beyond said limits the attachment feature resists or even prevents, such as mechanically blocks, the movement.

FIG. 1 also shows optional other electronic components 102, such as based on surface-mount devices (SMD), and conductive, such as printed, traces 101, which may be comprised in one or several electrical circuits of the assembly 100, or one or several electrical circuits of a host structure of the assembly 100.

Figure 2:
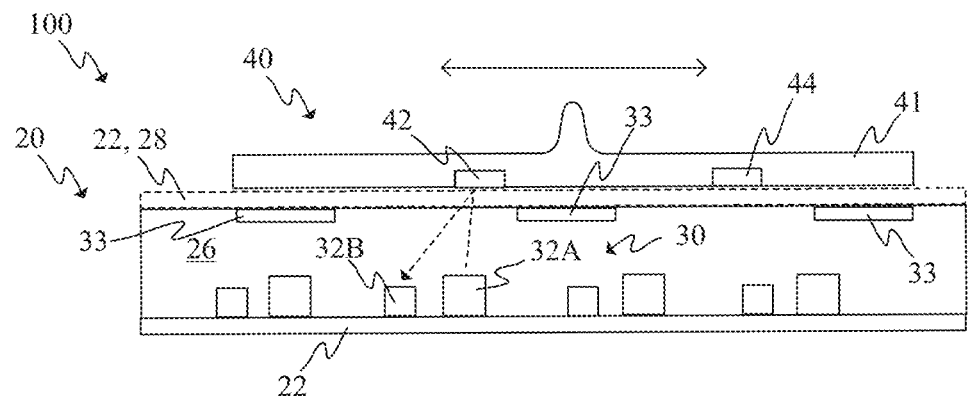
FIG. 2 illustrates an interface assembly.

FIG. 2 illustrates an interface assembly 100 according to some embodiments. In FIG. 2, the movable member 40, such as a slider or sliding member, is arranged to be moved in a translational manner, that is horizontally or in parallel relative to a lateral direction of the functional multilayer structure 20, or in a perpendicular direction relative to a thickness direction of the functional multilayer structure 20. As can further be seen, there can be a plurality of sensors 32A, 32B in the sensor arrangement 30. The movable member 40 may, preferably, comprise a body 41 or a frame portion 41.

Figure 3:
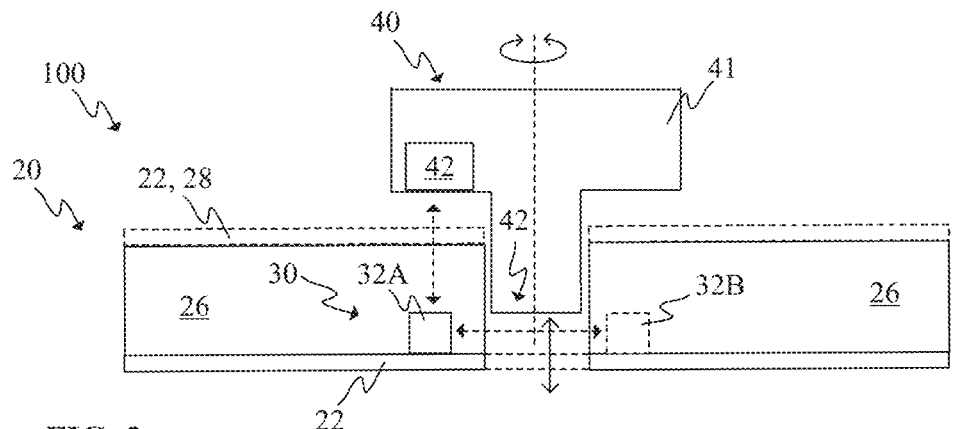
FIG. 3 illustrates an interface assembly.

Furthermore, as illustrated in FIG. 2, however, which also applies to FIGS. 1 and 3, for instance, the sensor arrangement 100 may comprise a plurality of sensors including either same type of sensors or at least two different types of sensors 32; 32A, 32B; 33 for detecting the position or the change of position of the at least one detection portion 42, 44. In FIG. 2, sensors 32A, 32B are, preferably, optical sensors but could alternatively be, for instance, sensors measuring magnetic field or change thereof. In addition, there are second sensors 33 which are, in this particular case, capacitive sensors. The types of sensors 32; 32A, 32B; 33 may, thus, be selected from the group consisting of: optical, capacitive, inductive, resistive, magnet, galvanic, audio, or any combination thereof. Furthermore, as one realizes, the movable member 40, and especially the at least one or two detection portions 42, 44 include corresponding portions to the types of sensors 32; 32A, 32B; 33.

For example, the optical sensor, such as comprising a transmitting and receiving portions, may operate so that the when the movable member 40 is moved, the optical signal is being cut or pass through or past the movable member 40. There may additional be magnetic or capacitive sensors, and corresponding detection portions 42,44 in the assembly 100. Thus, the detection of the position of the movable member 40 or change thereof can be more reliable made by using the different techniques, such as based on optics and capacitive sensing.

In preferable embodiments, the detection portions 42, 44 in the movable member 40, which correspond by their operation characteristics to the sensor(s) 32; 32A, 32B; 33 (as explained above), are passive in the sense that they do not require additional power supply or control signals. Furthermore, in these embodiments, the sensors 32; 32A, 32B; 33 are provided with the necessary electrical power and control circuitry and connections, such as being provided on the substrate 22, 28.

FIG. 3 illustrates an interface assembly 100 according to some embodiments. In FIG. 3, the movable member 40 is arranged to be moved at least in a rotational manner relative to the functional multilayer structure, optionally in the groove, the hole, or the through-hole. Alternatively, there may be a protrusion, a pin, or other shape which extends outward from the surface of the multilayer structure 20, around which the movable member 40 may rotate.

Alternatively or in addition, the movable member 40 may be moved in a translational manner, in this case vertically or in parallel direction relative to a thickness direction of the functional multilayer structure 20. As can further be seen here also, there can be a plurality of sensors 32A, 32B in the sensor arrangement 30. The movable member 40 may, preferably, comprise a body 41 or a frame portion 41.

Still further, the movable member 40 may be arranged to move in the thickness direction of the functional multilayer structure 20, that is to operate essentially as a push button. In these cases, the movable member 40 may not rotate or move translationally at all.

FIG. 3 illustrates that at least a portion of the movable member 40 may be arranged to extend, penetrate, or protrude into the substrate 22, 28, such as into a groove, a hole, or a through-hole in the substrate 22, 28.

FIG. 3 also illustrates that the detection portion 42 may, preferably, be in the portion of the movable member 40 which extends, penetrates, or protrudes into the substrate 22, 28. However, as shown in FIG. 2, the detection portion 42 may, preferably, be arranged at least so that it can function together with the sensor arrangement 30 in order for the movable member 40 being detectable by the sensor arrangement 30 based on a position or a change of position of the at least one detection portion 42 relative to the sensor arrangement 30.

Alternatively, the detection portion 42 may be arranged into a portion of the movable member 40 not extending, penetrating, or protruding into the substrate 22, 28, even if there exists such a portion. This option is also shown in FIG. 3.

As contemplated hereinbefore, FIGS. 1-3 also illustrate a detection portion 42 of the movable member 40. The detection portion 42 may just be a portion of the movable member 40, such as a (portion of) body thereof. For example, if the movable member 40 is of plastic material, the detection portion 42 may be a portion of the movable member 40 which is adapted to reside and/or move so that the sensor arrangement 100 is able to detect the position or change thereof. In some embodiments, the detection portion 42 may be of light reflecting or absorbing material, and/or of transparent, translucent, or opaque material. In some other embodiments, the detection portion 42 may be of electrically conductive material and/or of ferromagnetic material. The detection portion 42 may, for example, comprise a permanent magnet or several permanent magnets. Alternatively, in some embodiments, the detection portion 42 may be or comprise an electromagnet or a light emitting and/or detecting device, and/or a sensing coil or electrode or the like in connection with a processing and/or power supply unit. Thus, the detection portion 42 may at least include an active component, in which case the movable member 40, preferably, also comprises means to operate and/or control the active component.

Regarding the sensor arrangement 30, the at least one sensor 42 may be at least one optical sensor 32A arranged to transmit an optical detection signal for detecting the position or the change of position of the at least one detection portion 42.

Alternatively, the at least one sensor 32 may be one or several magnets and/or ferromagnetic elements, and the sensor arrangement 30 may comprise a magnetometer, such as comprising a magnetometer, such as comprising a coil, or a Hall effect sensor for detecting position or change of position of the one or several magnets.

Still alternatively or in addition, the sensor arrangement 30 may comprise a capacitive sensing element, as a sensor 32, for detecting the position or the change of position of the at least one detection portion 42. In such embodiments, the detection portion 42 may or may not comprise another capacitive element. Alternatively, the movable member 40 may be such as affecting the field measured or monitored by the sensor arrangement 30.

Figure 4:
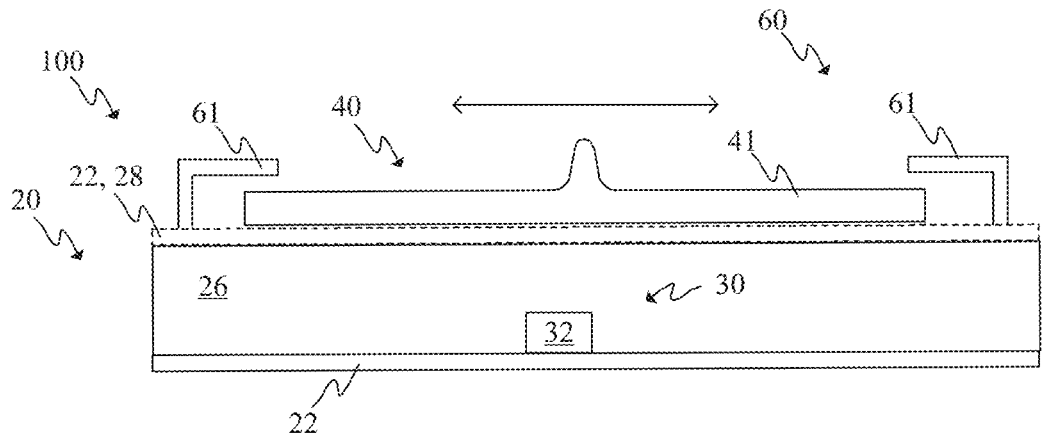
FIG. 4 illustrates an interface assembly with an attachment feature.

FIG. 4 illustrates an interface assembly 100 with an attachment feature 60. In FIG. 4, the movable member 40 and the functional multilayer structure 20 may be, for example, similar or even identical as illustrated in and described in connection with FIG. 2, although the following applies also to various other embodiments, such as the one or similar as in FIG. 3. There is shown, in FIG. 4, one example of the attachment feature 60. As stated hereinbefore, the attachment feature 60 is, preferably, arranged to provide attachment of movable member 40 relative to the functional multilayer structure 20 in a movable manner.

FIG. 4 illustrates that the attachment feature 60 is a mechanical attachment arrangement comprising a frame 61 adapted to at least partly confine the movable member 40 between the frame 61 and the functional multilayer structure 20 so that the movable member 40 is movable in a space between the frame 61 and the functional multilayer structure 20. As can be seen, the frame 61 may be arranged onto the substrate 22, 28 or even directly on the molded material layer 26. The frame 61 is, preferably, at least releasably attached to the multilayer structure 20. Alternatively or in addition, the attachment feature 60 may comprise a groove, a hole, or a through-hole in the functional multilayer structure 20 in which the movable member 40 at least partly extends or even completely resides in. As understood, the shape, size, material(s) used, etc. of the frame 61 may vary between embodiments. The most important aspect of the mechanical attachment arrangement is to prevent or at least hinder or resist detachment of the movable member 40 with respect to the functional multilayer structure 20.

Figure 5:
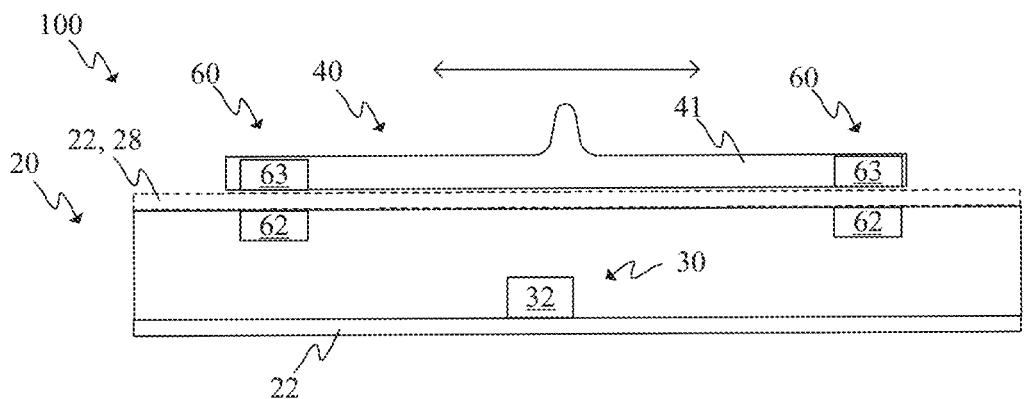
FIG. 5 illustrates an interface assembly with an attachment feature.

FIG. 5 illustrates an interface assembly 100 with another attachment feature 60. In this case too, the movable member 40 and the functional multilayer structure 20 may be, for example, similar or even identical as illustrated in and described in connection with FIG. 2, although the following applies also to various other embodiments, such as the one or similar as in FIG. 3. In FIG. 5, the attachment in movable manner includes a magnetic attachment arrangement comprising a first attachment portion 62 on the functional multilayer structure 20 and a second attachment portion 63 on the movable member 40, wherein the magnetic attachment arrangement is arranged to exert an attractive magnetic force between the first 62 and second attachment portions 63.

In some embodiments, the interface assembly 100 may comprise one or several mechanical attachment arrangements and one or several magnetic attachment arrangements.

Figure 6:
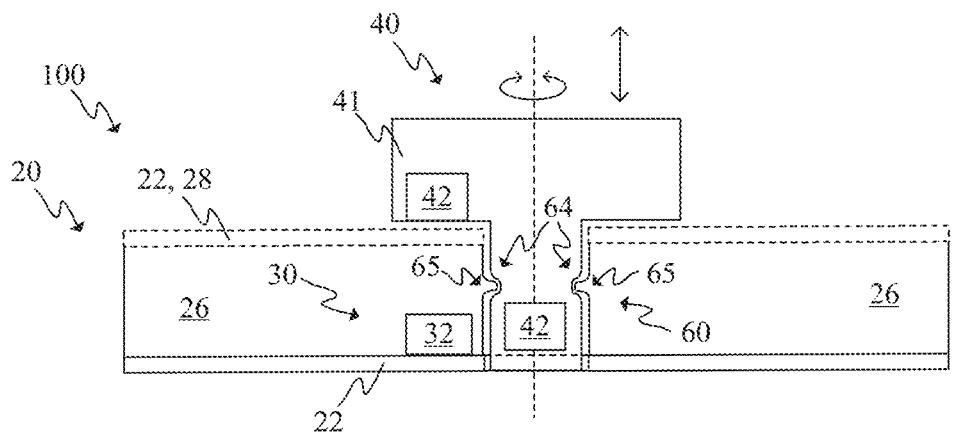
FIG. 6 illustrates an interface assembly with an attachment feature.

FIG. 6 illustrates an interface assembly 100 with still another attachment feature 60. The assembly 100 may comprise a shape interlocking arrangement between a portion of functional multilayer structure 20, such as of the groove, the hole, or the through-hole, and the movable member 40 so as to prevent or at least hinder detachment of the movable member 40 with respect to the functional multilayer structure 20.

In FIG. 6, there is/are protruding element(s) 65 in the functional multilayer structure 20, namely in the wall of the through-hole therein, and corresponding recess(es) 64 in the portion of the movable member 40 extending into the through-hole. Naturally, these could be the other way around, that is having the protruding element(s) 65 in the movable member 40 and so on. Thus, the movable member 40 may be provided into the through-hole, such as by pushing hard enough, so that the protrusions 65 slip into the recesses 64, thereby locking the movable member 40 in a movable manner relative to the multilayer structure 20. As understood, the interlocking shapes/joint should be such as it allows the movement of the movable member 40. In FIG. 6, the rotating movement of the movable member 40 is clearly possible, but movement away and towards the structure 20 is limited, unless significant amount of force is applied.

Furthermore, in various embodiments, any of the attachment arrangements shown in and described in connection with FIGS. 4-6 may be utilized, or any combination thereof. One realizes that said mechanical, magnetic, and interlocking shapes/joints may have different shapes, sizes, related materials. etc. Furthermore, there may be grooves, recesses, protruding portions, hole, through-holes in the multilayer structure 100, or the attachment arrangement may be completely separate, such as a frame, which is arranged at least partly on the movable member 40 after the movable member 40 has been arranged in connection with the structure 20 to be operated in movable manner.

FIG. 7 illustrates another interface assembly 100. In FIG. 7, the movable member 40 may be arranged to rotate and/or move vertically. In this case, as already mentioned hereinbefore, the sensor arrangement 100, which comprises the at least one sensor 32, for example, a rotary switch or a microswitch, additionally comprises a body 34 or a frame 34 defining a cavity, including a space or a volume, inside of which the sensor 32 has been arranged. The body 34 may be, for example, a piece of a printed circuit board (PCB) or the like substrate (material).

As indicated in FIG. 7 with horizontal dashed lines, the body 34 may be a single piece body 34, such as a U-shaped piece of PCB, wherein the cavity has been formed, such as carved, drilled or milled, into a piece of PCB. Alternatively, the body 34 may be provided from a plurality of pieces, for example, having a horizontal or laterally extending portion hosting the sensor 32, such as shown in FIG. 7, and then vertically extending side wall(s) (such as of PCB or of plastic material) extending from the first substrate 22 or the laterally extending portion up to the second substrate 28, thus enclosing the sensor 32 from being overmolded into the molded material layer 26. In some embodiments, the side wall may be a round or ring-shaped so that it surrounds the sensor 32. Thus, the sensor arrangement 100, when the molded material layer 26 is provided on a first side of the first substrate 22, 28, becomes at least partly embedded into the molded material layer 26 as the molded material surrounds and comes in contact with the body 34 on the opposite side relative to the cavity.

In embodiments, in which the body 34, such as at least the horizontal or laterally extending portion thereof, is PCB or similar substrate, the body 34 may be used to provide electrical connections to the sensor 32. The body 34 may comprise connection portion(s) 39 for providing electrical connection into the sensor arrangement 100 from outside the sensor arrangement 100, such as from the first substrate 22. Said connection portions 39 may be on the opposite side of the horizontal or laterally extending portion relative to the sensor 32 and/or molded material layer 26, or on the side surface of the horizontal or laterally extending portion or the sidewall(s). In FIG. 7 is shown an example in which said connection portions 39 are arranged to side surfaces of the horizontal or laterally extending portion. The connection portions 39 may be, for example, castellated holes cut in half or plated half-holes. Thus, the electrical connection may be provided from the conductive trace 24 to the connection portion 39, for example, by using solder material. FIG. 7 further shows adhesive 29, such as structural adhesive being electrically insulating, being arranged to attach the body 34 to the first substrate 22.

FIGS. 8A-8C illustrate an interface assembly 100 which, in this case, includes a mechanical button or the like, being movable towards and away from the functional multilayer structure 20. FIG. 8C shows the interface assembly 100 as a perspective view on the side of the assembly 100 having at least a portion of the movable member 40 visible. FIG. 8C also shows the sections on A-A and B-B. FIG. 8A shows section on A-A and FIG. 5B section on B-B. Even if shown as being perpendicular relative to each other, this may not necessarily be the case.

FIG. 8A illustrates that at least one sensor 32 is arranged embedded into the molded material layer 26. The sensor 32 may be, for example, a Hall sensor or a Reed switch or a sensing coil for sensing a change in magnetic field. Therefore, when the movable member 40 is being pushed towards the multilayer structure 20, the sensor 32 detects change in the magnetic field. The same is true when the movable member 40 is moved away from the structure 20. Thus, the detection portion 42 is, preferably, a permanent magnet or a plurality of permanent magnets.

In FIG. 8B, which shows a second on B-B which is at a different position than the section A-A, there is also shown first permanent magnets 51 in the movable member 40. The first permanent magnets 51 are arranged to interact with second permanent magnets 52 in the functional multilayer structure 20. The first 51 and the second permanent magnets 52 are arranged to cause repulsive force therebetween. This means that when the movable member 40 is pushed down and the released, the movable member 40 moves away from the structure 20 due to the repulsive force between the first 51 and the second permanent magnets 52. In preferable embodiments, the magnets of the detection portion 42 and the first permanent magnets 51 may be identical and placed, for example, in turns or in some other pattern around a vertical center axis of the movable member 40. On the other hand, the detection portion 42 may be on the portion extending into the hole in the structure 20, if any, while the first permanent magnets 51 are as shown in FIG. 8B.

Figure 9:
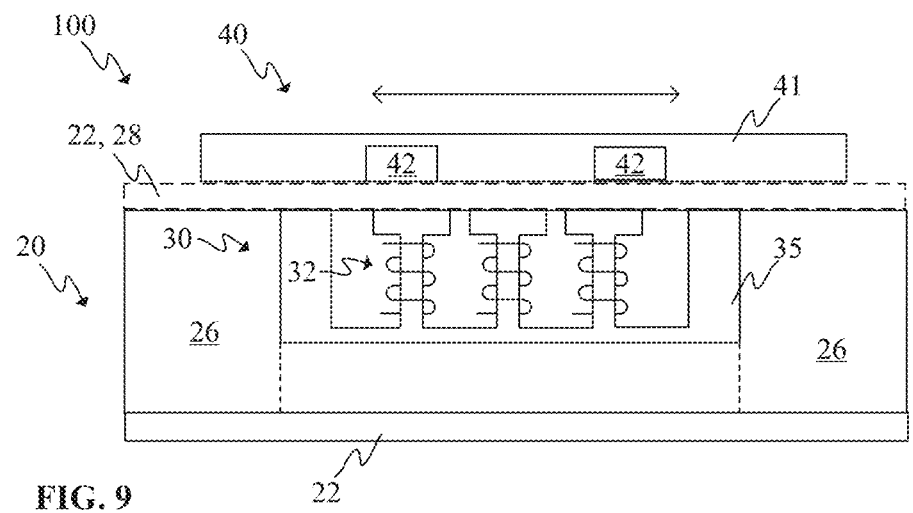
FIG. 9 illustrates an interface assembly.

FIG. 9 illustrates an interface assembly 100. The movable member 40, or "slider", in FIG. 9 comprises permanent magnets as the detection portions 42. Furthermore, the functional multilayer structure 20 comprises a coil assembly, wherein the sensors 32 are coils and are comprised in the coil assembly. Furthermore, the coil assembly may comprise a magnetic core 35 around, such as around teeth thereof, the coils have been wound. The coils can further be connected to a sensing unit (not shown) comprising, for example, a sensing circuit and a processing unit.

In addition to measuring the position or change thereof of the movable member 40, the coils may also be utilized to vibrate the movable member 40. This may be done by injecting appropriate current pattern into the coils, thus producing a, preferably varying, magnetic field which then, when interacting with the magnets of the movable member 40, causes the movable member 40 to vibrate. This way a tactile, such a vibrotactile, feedback may be produced by the interface assembly 100.

Figure 10:
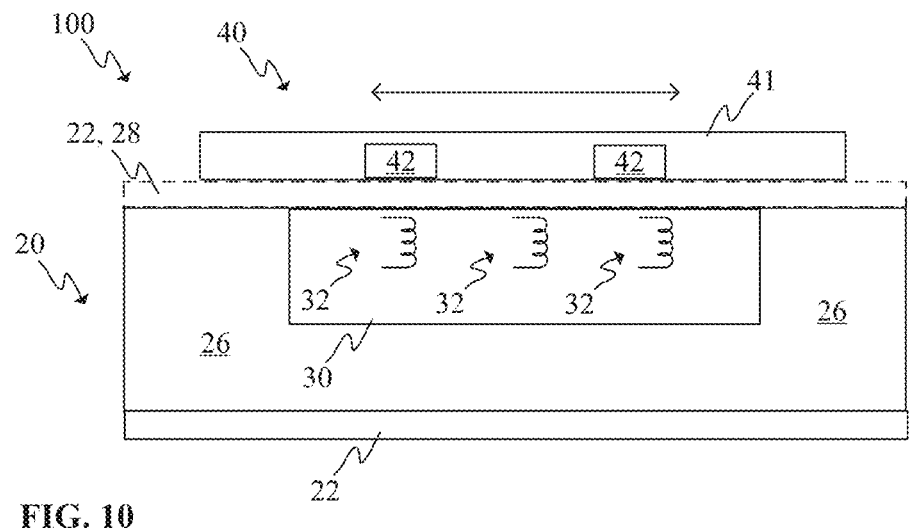
FIG. 10 illustrates an interface assembly.

FIG. 10 illustrates an interface assembly 100. The operation principle is generally the same as in embodiments according to FIG. 9, however, the coils have been provided on a substrate, such as a multilayer PCB. Thus, the coils may have been provided by utilizing etching. In some other embodiments, conductive traces forming the coils in a substrate, such as a multilayered substrate, may have been printed by means of printed electronics techniques. Examples of such techniques are screen printing, flexography, and inkjet printing, or 3D printed, being substantially additive printing process (compared to etching, for instance).

In various embodiments the electrically and/or thermally conductive elements (traces, pads, connection elements, electrodes, etc.) may include at least one material selected from the group consisting of: conductive ink, conductive nanoparticle ink, copper, steel, iron, tin, aluminium, silver, gold, platinum, conductive adhesive, carbon fibre, graphene, alloy, silver alloy, zinc, brass, titanium, solder, and any component thereof. The used conductive materials may be optically opaque, translucent and/or transparent at desired wavelengths, such as at least portion of visible light, so as to mask or let the radiation such as visible light to be reflected therefrom, absorbed therein or let through, for instance. As practical examples of feasible conductive material, e.g. Dupont™ ME602 or ME603 conductive ink may be utilized.

Figure 11A:
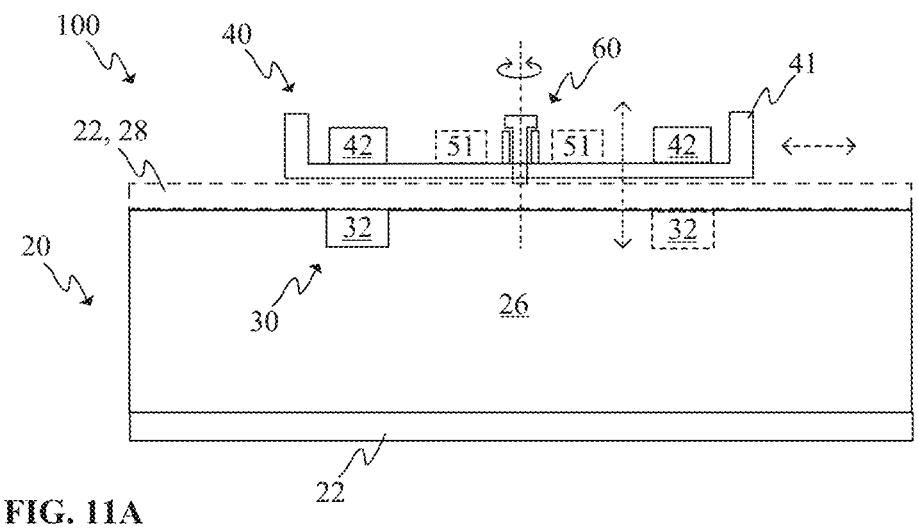
FIGS. 11A, 11B and 11C illustrate an interface assembly.
Figure 11B:
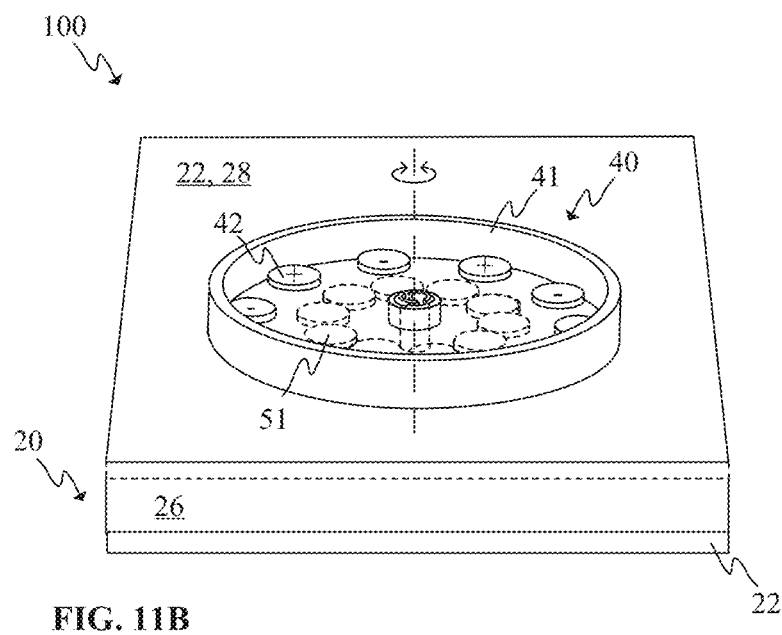
Figure 11C:
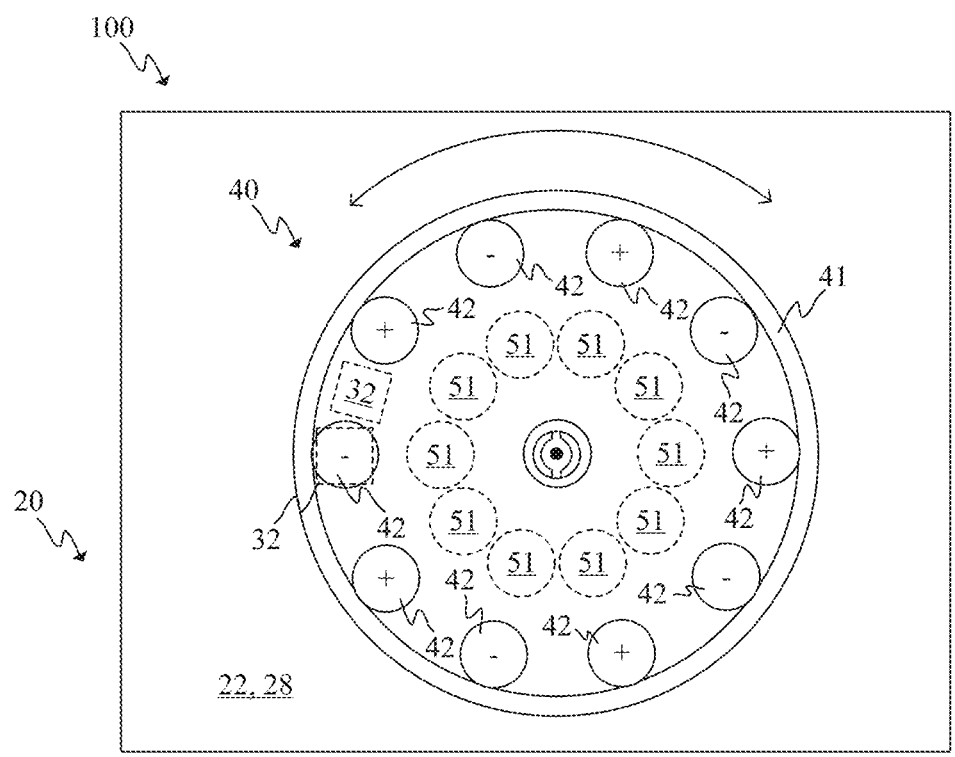

FIGS. 11A-11C illustrate an interface assembly 100. FIG. 11A shows the interface assembly 100 as a sectional view from a side, FIG. 11B as a perspective view, and FIG. 11C from above, that is from the side of the assembly 100 where the movable member 40 resides.

The movable member 40 in FIGS. 11A-11C is a rotatable movable member 40. In this case, it has been attached movably to the functional multilayer structure 20 by an attachment feature 60, that is by a mechanical attachment arrangement, comprising a rotation axis or shaft. FIG. 11A shows that in this case the attachment feature 60 limits the movement in lateral directions and also in upward direction by the flanges at the top end of the rotation axis or shaft.

The attachment feature 60 may be a separate shaft being attached onto the surface of the structure 20. Alternatively, the attachment feature may, at least partly, an integrated part of the structure 20, such as substrate 22, 28 or the molded material layer 26 thereof. Thus, the attachment feature 60 may be a protrusion, a pin, or other shape extending outward from the structure 20. The movable member 40 may be arranged to move, such as rotate, around the protrusion, the pin, or said other shape.

Alternatively or in addition, as shown in FIG. 11A, the movable member 40 may be movable in the vertical direction (the thickness direction of the structure 20 or direction of the surface normal of the structure 20) and/or the horizontal direction (the lateral direction of the structure 20) of the figure, as is explained hereinbefore in connection with other figures.

FIG. 11B illustrates that the body 41 of the movable member 40 is, in this case, U-shaped, however, could exhibit some other shape as well. There is a plurality of detection portions 42, being, for example, permanent magnets or pieces of magnetic material, such as of ferromagnetic material, arranged the rotation axis or shaft. In this case, the magnets are arranged on the outer peripheral portion of the body 41, however, could be close to the rotation axis or shaft as well. The detection portions 42 may alternatively or in addition be of magnetic material, such as ferromagnetic material. For example, the detection portions 42 may comprise iron or iron alloy, or the like material with magnetic properties that can be detected by a magnetometer or the like.

Furthermore, as can be seen, the permanent magnets may be arranged so that every other magnet has its magnetic poles pointing in different direction than the adjacent magnet, that is with alternating polarities. Thus, the direction of the magnetic fields alternates when moving from one magnet to another.

The operation principle of the interface assembly 100 in accordance with FIGS. 11A-11C is best understood by looking at FIG. 11C. FIG. 11C illustrates that the interface assembly 100 comprises at least two sensors 32 in the sensor arrangement 30. The sensors 32 are arranged to be in the functional multilayer structure 20 and at the corresponding position with the round rotation path of the permanent magnets. In this particular embodiment, the sensors 32 are placed so that when one is aligned with one of the magnets, the other sensor 32 is between two adjacent magnets. The arrangement of sensors 32 and/or detection portions 42, being permanent magnets, can also differ from what is described hereinabove.

Therefore, the rotation of the movable member 40 causes the sensors 32, which are adapted to measure magnetic field or change thereof, measure changing magnetic field in turns. The sensor arrangement 30 can thus be arranged to determine speed and direction related to the rotation of the movable member 40.

FIGS. 11A-11C further shows optional first permanent magnets 51. Even if not shown, there can be second permanent magnets 52 in the multilayer structure 20, such as in FIG. 8B. Alternatively, there can be coils (see FIGS. 9 and 10) below the first permanent magnets 51 to enable providing tactile feedback to the movable member 40.

Regarding the operation of the interface assembly 100 in FIGS. 11A-11C, when the movable member 20 is being rotated, the sensor(s) 32 detect changes in the magnetic field when the magnets 42 move pass the sensor(s) 32. In case there are magnets 42 with alternating polarities, as shown, the sensors 32 can detected the change, including the polarity (or the direction of the magnetic field) since every other magnet 42 causes the change with opposite polarity compared to the previous one. Thus, the sensor(s) 32 produce a sensing signal representative or indicative of the movement of the movable member 40.

In various embodiments, the interface assembly 100 may comprise a spring arranged to interact with the movable member 40. For example, the movable member 40 may be mechanically coupled to the functional multilayer structure 20 via a spring. On the other hand, the movable member 40 may, in one position, not in contact with the spring, however, when being moved, then becoming in contact with the spring. The spring may be, for example, a coil spring or a leaf spring which is arranged to compress or extend/stretch from its resting position when the movable member 40 is being moved, such as in a translational manner; vertically or horizontally/laterally. In some embodiments, a center portion of the spring may comprise a through-hole through which the movable member 40 extends towards the functional multilayer structure 20.

Figure 12A:
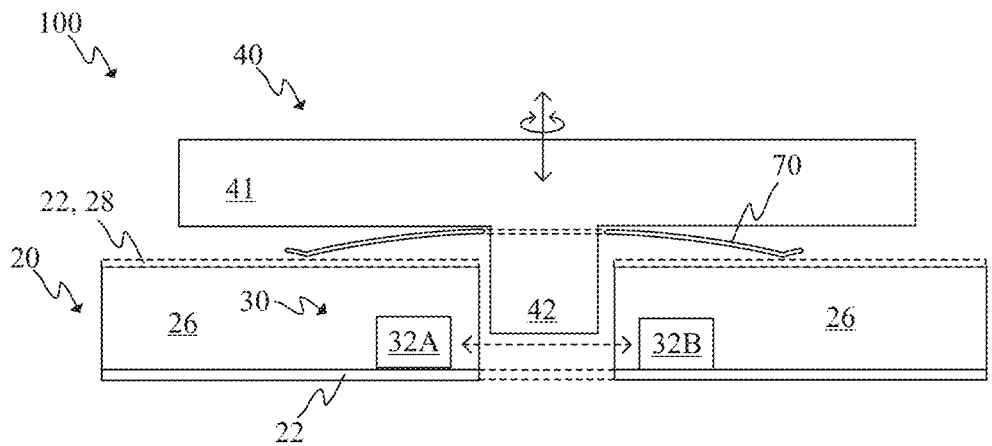
FIGS. 12A and 12B illustrate an interface assembly.
Figure 12B:
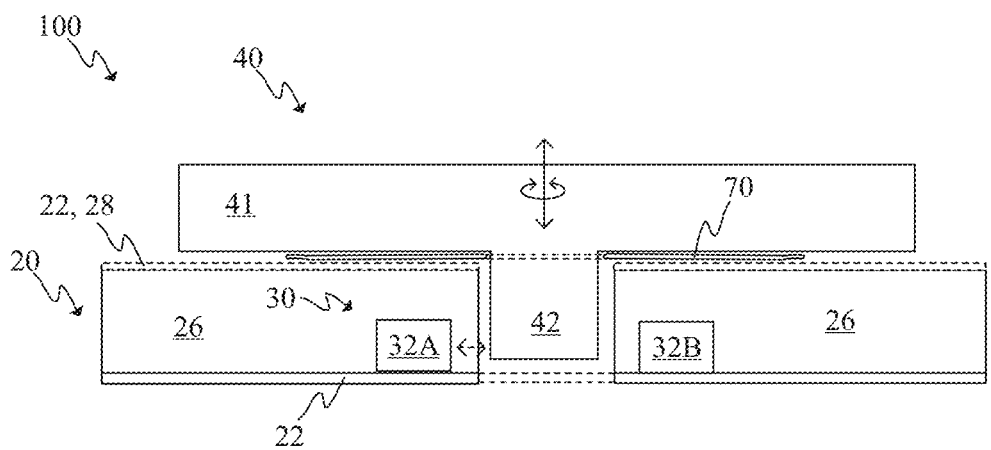

FIGS. 12A and 12B illustrate an interface assembly 100. In this case, the movable member 40 may be moved by rotating and/or by pushing it downwards. However, the interface assembly 100 further comprises a spring 70. In FIG. 12A, the spring 70 is in its resting position or at most partly compressed. In FIG. 12B, the spring 70 is essentially completely compressed. The spring 70 in FIGS. 12A and 12B is a dome-shaped spring. When the spring 70 is not completely compressed, an edge portion or portions of the dome are in contact with one of the functional multilayer structure 20 (such as the first 22 or the second substrate 28, or the molded material layer 26) and the movable member 40, and a center portion of the dome is spaced apart from the other of the functional multilayer structure 20 and the movable member 40. FIGS. 12A and 12B illustrate that the edge portion is in contact with the functional multilayer structure 20. The dome-shaped spring 70 in FIGS. 12A and 12B may be of plastic, such as of a thermoformable plastic film, or metal material. The center portion of the spring 70 may comprise the through-hole through which the movable member 40 may extend towards the functional multilayer structure 20. In some embodiments, the movement of the movable member 40 may cause buckling of the spring 70.

The interface assembly 100 of FIGS. 12A and 12B operate so that in case of FIG. 12A, there is a clear path between the sensor 32A and 32B. For example, sensor 32A may emit optical wave, such as light or infrared, for instance, towards the sensor 32B which can be used to record or detect the emitted wave. In FIG. 12B, the movable member 40 is pushed down and a portion thereof, that is the detection portion 42, obstructs the path. This can be detected by the sensor 32B which no longer receives the emitted wave. Of course, alternatively, the movable member 40 may obstruct the path in the first position, that is corresponding to FIG. 12A, and then allow the emitted wave to reach the sensor 32B in the second position, that is corresponding to FIG. 12B. The detection portion 42 of the movable member 40 may, for example, comprise a through-hole or a portion including transparent material in view of the emitted wave. It should be noted that the sensor 32B may also be, for example, a reflective surface which is arranged to reflect the emitted wave back to sensor 32A which is arranged to detect the reflected signal.

Figure 13:
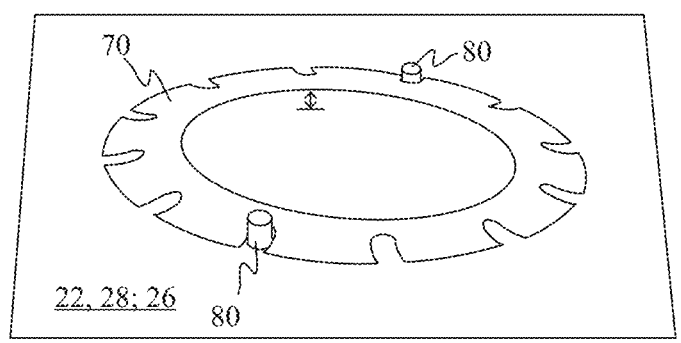
FIG. 13 illustrates a spring having a segmental dome shape.

FIG. 13 illustrates a spring 70 having particularly advantageous a segmental dome shape. The small arrow in the figure indicates that the center portion is spaced apart from the level of the edge portion or portions. The spring 70 operated basically the same way as described above with respect to the dome-shaped spring. The segmental dome shaped spring when not completely compressed, an edge portion or portions of the segmental dome are in contact with one of the functional multilayer structure 20 (such as the first 22 or the second substrate 28, or the molded material layer 26) and the movable member 40, and a center portion of the dome is spaced apart from the other of the functional multilayer structure 20 and the movable member 40. FIG. 13 illustrates that the edge portion is in contact with the functional multilayer structure 20. The dome-shaped spring 70 in FIG. 13 may, preferably, be of plastic material, such as of a thermoformable plastic film. The center portion of the segmental dome shaped spring may comprise the through-hole through which the movable member 40 may extend towards the functional multilayer structure 20.

Alternatively, the spring 70 may be a planar spring, such as an ortho-planar spring. It may also be of plastic material, such as of a thermoformable plastic film. In case of planar spring, the functional multilayer structure 20 may, for example, comprise a hole, recess, or cavity into which the planar spring can extend when the movable member 40 is being moved towards the structure 20. Alternatively, the planar spring may extend into such hole, recess, or cavity in the movable member 40, or there may be such holes, recesses, or cavities in both of the structure 20 and the movable member 40. Still alternatively, a support frame, such as a support ring or the like, may be utilized for providing space for the planar spring to move.

The spring 70 may, when being compressed, slide on the surface of the structure 20 and the movable member 40. On the other hand, FIG. 13 further illustrates a spring support member 80, such as a pin or the like or a protruding shape, for providing support to the spring 70 in the lateral direction in the figure. The spring support member 80 or members 80 may be arranged to the structure 20 or the movable member 40, depending on the embodiment, so that they align with the grooves or holes or other counter elements in the spring 70. Preferably, the support member(s) 80 may provide support for the spring 70 so that when the spring 70 is being compressed, it will become in contact with the support member 80 in a perpendicular direction relative to the movement direction of the movable member 40.

Alternatively, the spring element 70 may be arranged into a hole or cavity or other structure, such as a ring, defining outer walls against which the spring element 70 can become in contact with, when being compressed, or basically in all positions.

Figure 14A:
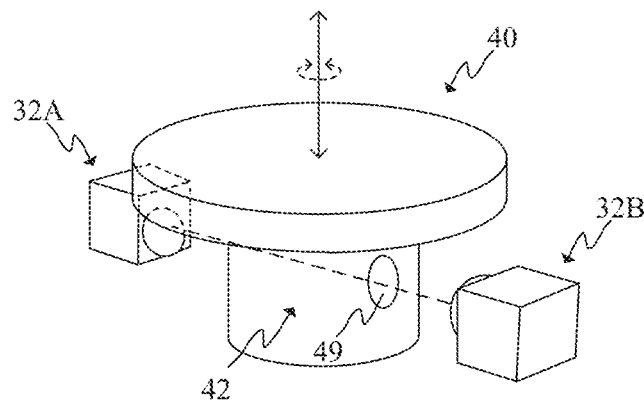
FIGS. 14A, 14B and 14C illustrate an interface assembly.
Figure 14B:
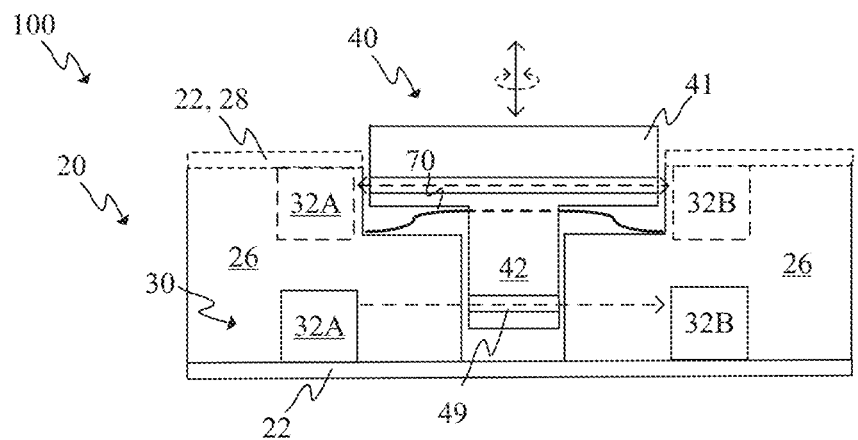
Figure 14C:
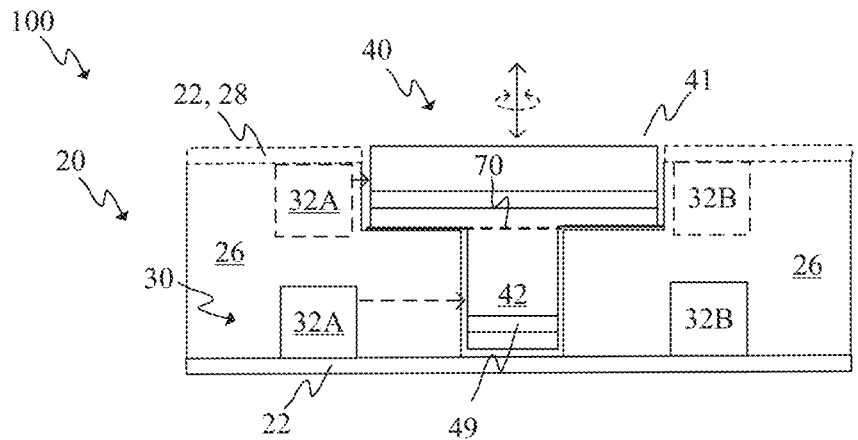

FIGS. 14A-14C illustrate an interface assembly 100. FIG. 14A illustrates, for the sake of readability, only the movable member 40 and the sensors 32A, 32B. The movable member 40 may comprise, in or as its detection portion 42, a through-hole 49 or channel 49 extending laterally through the movable member 40. The purpose of the through-hole 49 or channel 49 is to pass through the optical wave, such as light, when the movable member 40 is in a first position relative to the functional multilayer structure 20. The operation of the assembly 100 is described in more detail in connection with FIGS. 14B and 14C.

FIG. 14B illustrates the movable member 40 in the first position. As can be seen, the signal emitted by the sensor 32A can pass through the channel 49 and is received by the sensor 32B. FIG. 14C, on the other hand, shows the movable member 40 in the second position. The movable member 40 has been pressed down and the channel 49 does not anymore align with the sensors 32A, 32B. Thus, detection of the position and/or change thereof of the movable member 40 can be performed. In visible in FIGS. 14B and 14C, the assembly 100 may, optionally, comprise a spring 70. In various embodiments, the movable member 40 may also be rotatable.

FIGS. 14B and 14C illustrates also alternative embodiments, wherein the channel 49 is arranged, as shown, to a portion of the movable member 40 which is closer to the surface of which the movable member 40 is to be operated, that is the outer surface. In such embodiments, the sensor(s) 32; 32A, 32B may be provided on the substrate 22, 28 close to the outer surface, as shown. There may or may not be another substrate 22 then on the opposite side of the molded material layer 26 which at least partly embeds the sensor arrangement 30.

Figure 15A:
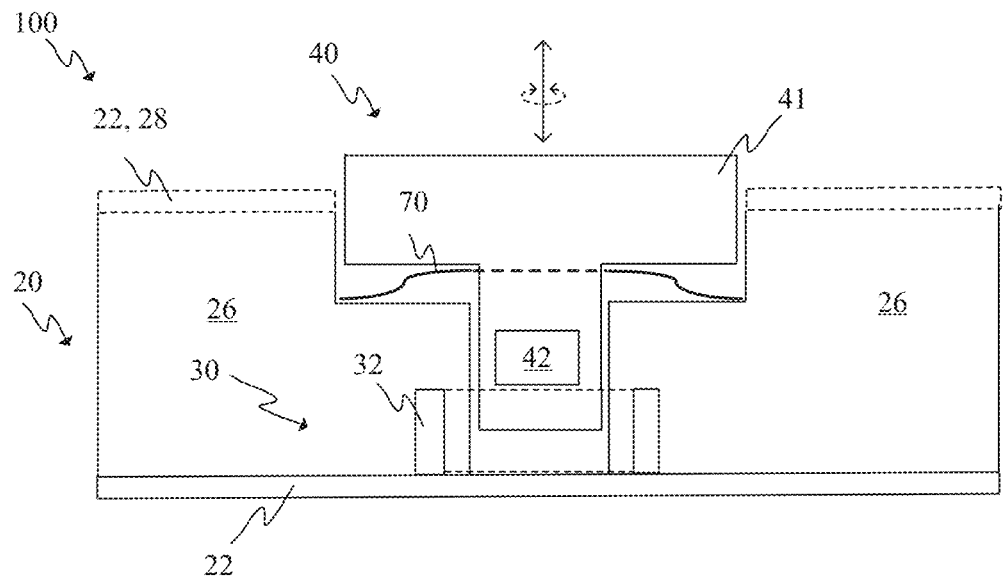
FIGS. 15A and 15B illustrate an interface assembly.
Figure 15B:
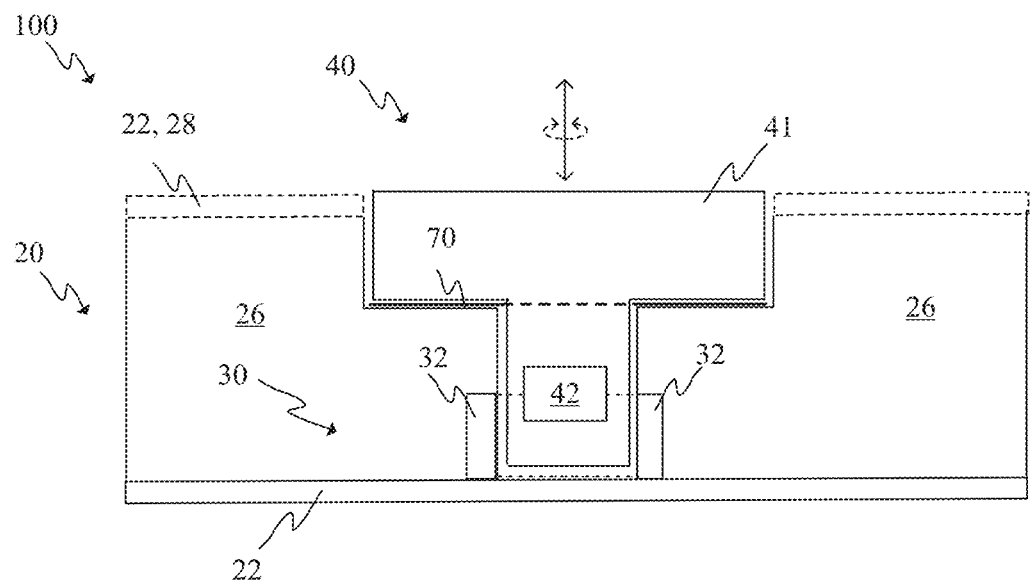

FIGS. 15A and 15B illustrate an interface assembly 100. The movable member 40 comprises the detection portion 42 which is a permanent magnet or a set of permanent magnets, or other material which affects surrounding magnetic field. The functional multilayer structure 20, on the other hand, comprises at least one sensor 32 which is a coil. The coil may be similar to a voice coil of a speaker, that is, comprising a support ring around which the coil is wound. Thus, when the movable member 40, especially the magnet or magnetic material, moves towards the coil, there is current being induced into the coil which can be used to detect motion of the movable member 40. As visible in FIGS. 15A and 15B, there may be a spring 70 arranged between the movable member 40, which may be movable in a translational manner (vertically) and, optionally, also rotatable manner, and the multilayer structure 20. In various embodiments, the movable member 40 may also be rotatable as shown with two-headed arrow with a dashed line.

In FIGS. 15A and 15B, the coil may also be utilized to provide movement to the movable member 40. By injecting current into the coil, the produced magnetic field due to the injected current interacts with the detection portion 42 of the movable member 40, thereby enabling movement of the movable member 40. This may be used to at least cause vibrations, for instance, but could be utilized even to produce sound.

In some embodiments, the movable member 40 may be essentially as the spring 70 shown in FIG. 13, however, the center portions being solid material, and not including a through-hole. Optionally, the center portion may comprise ferromagnetic material which can be moved by varying magnetic field around it. Furthermore, such movable member 40 comprises support member 80 which fix the edge portions of the movable member 40 relative to the functional multilayer structure 20. Furthermore, the material of such movable member 40 is, at least with respect to its edge portion or portions, flexible, thus enabling movement of the movable member 40 relative to the structure 20.

Figure 16A:
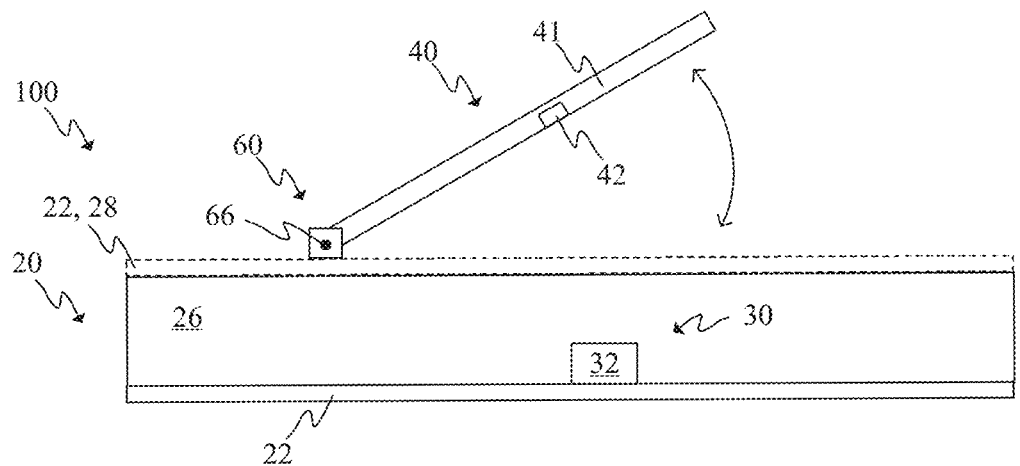
FIGS. 16A and 16B illustrate interface assemblies.
Figure 16B:
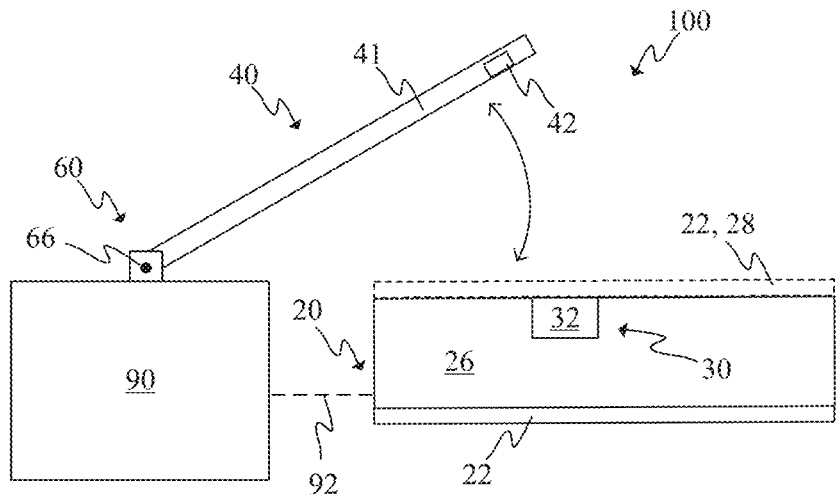

FIGS. 16A and 16B illustrate interface assemblies 100. In FIG. 16A, the interface assembly 100 comprises the movable member 40 arranged to move relative to the functional multilayer structure 20 in a hinged manner. The movable member 40 may thus rotate around a pivot point which is preferably, however, not necessarily, arranged to an end of the movable member 40, if having a longitudinal shape as shown in FIG. 16A. The movable member 40 may be, for example, a switch.

The attachment feature 60 in FIGS. 16A and 16B may include a hinge 66 or hinges 66. Optionally, the movable member 40 may be arranged to be away from the functional multilayer structure 20 when being in an idle position, that is not being operated or touched. There may be, for example, a spring keeping the movable member 40 in the idle position. In some embodiments, the hinge 66 may be at least partly an integral portion of the functional multilayer structure 20, such as a protruding portion of a substrate 22, 28 and/or the molded material layer 26. Alternatively, the hinge 66 may be a separate structure being attached to the functional multilayer structure 20. Alternatively, the idle position may be when the movable member 40 is in the position closer to the structure 20.

FIG. 16B illustrates another interface assembly 100 with a movable member 40 being arranged in a hinged manner. In these embodiments, the movable member 40 is not attached to the functional multilayer structure 20 but rather to a host structure 90. Preferably, the host structure 90, such as substrate or other support structure, may become, when installed for use, fixed relative to the multilayer structure 20 by a fixing arrangement 92. The fixing arrangement 92 may be, for example, another substrate or support member onto which both the host structure 90 and the functional multilayer structure 20 have been arranged. Of course, the functional multilayer structure 20 may be directly attached to the host structure 90.

Furthermore, the movable member 40 may comprise, for example, a magnet, metal material, such as magnetic metal material, or optically reflective material, or a capacitive sensing element or the like. The functional multilayer structure 20, and especially the sensor arrangement 30 thereof, may comprise a magnetic sensor for measuring magnetic field or change thereof, an inductive sensor, such as including a coil or coils, a capacitive sensor, or an optical sensor, such as comprising a transmitter and a receiver. Therefore, the position and/or change thereof of the movable member 40 may be determined or detected based on the sensor arrangement 30.

Figure 17A:
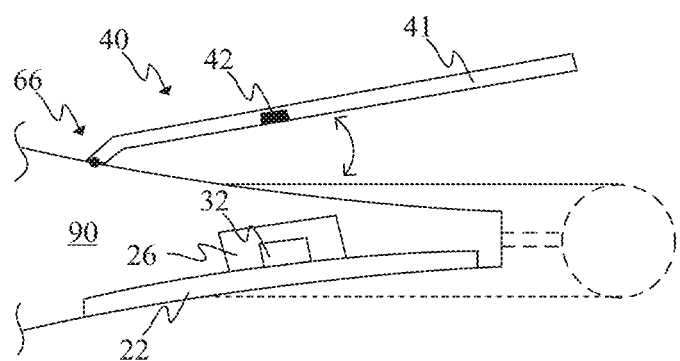
FIGS. 17A, 17B and 17C illustrate interface assemblies in a host structure, and a steering wheel.
Figure 17B:
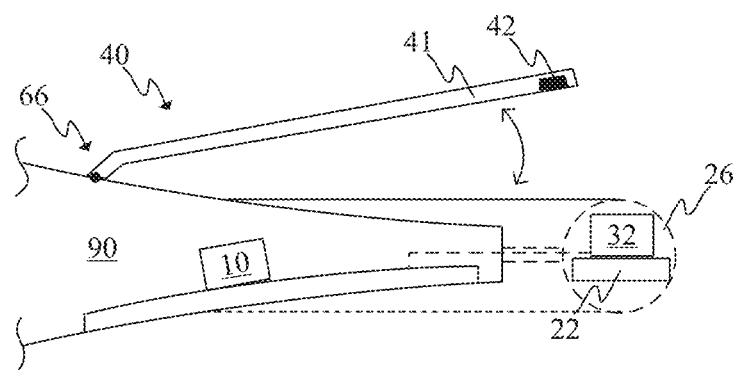
Figure 17C:
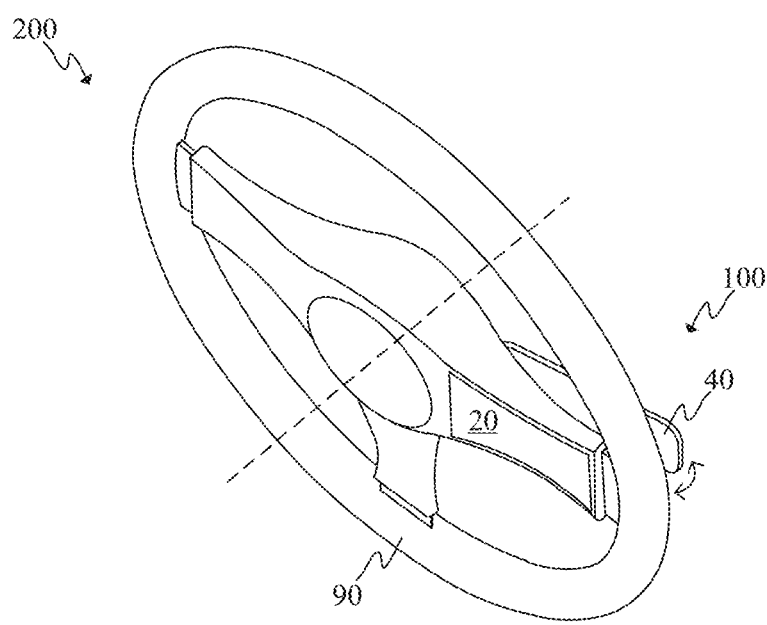

FIGS. 17A-17C illustrate interface assemblies 100 in a host structure 90, and a steering wheel 200. FIG. 17A illustrates an interface assembly 100 the movable member 40 arranged to move relative to the functional multilayer structure 20 in a hinged manner. The movable member 40 is attached to the functional multilayer structure 20 by a hinge 66 or hinge arrangement 66.

FIG. 17B illustrates an interface assembly 100 the movable member 40 arranged to move relative to the functional multilayer structure 20 in a hinged manner. The movable member 40 is attached to the host structure 90 by a hinge 66 or hinge arrangement 66. The host structure 90 is, preferably, fixed relative to the functional multilayer structure 20.

FIG. 17C illustrate an interface assembly 100 shown in FIG. 17B with a perspective view. As can be seen, the interface assembly 100 is arranged on a host structure 90 which is, in this case, a steering wheel 200. The steering wheel 200 comprises a steering wheel body that defines handle portion(s) and a center portion. The axis of rotation of the steering wheel 200 is shown with a dashed line. The interface assembly 100 is arranged to an intermediate portion of the steering wheel, the intermediate portion residing between the center portion and the handle portion (s). As can be seen, the movable member 40 is arranged and attached in a hinged manner to a rear side of the center portion of the steering wheel 200. Alternatively, the movable member 40 could be arranged and attached in a hinged manner to a rear side of the intermediate portion of the steering wheel 200. The user can, thus, easily operate the movable member 40 by his hand when holding the handle portion of the steering wheel 200.

Figure 18A:
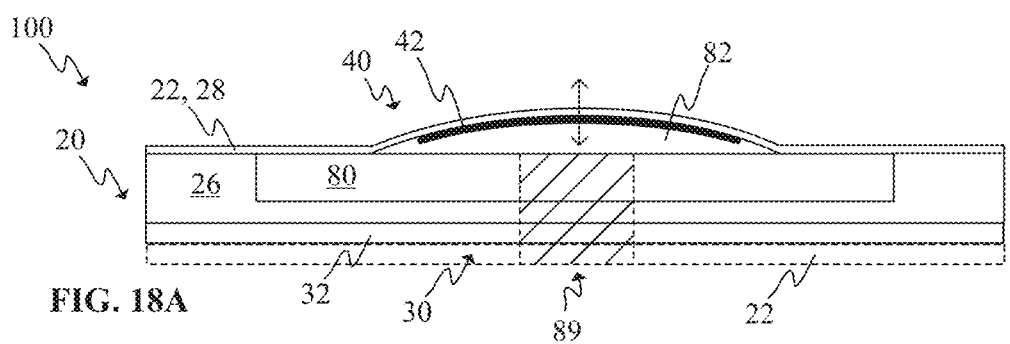
FIGS. 18A and 18B illustrate interface assemblies.
Figure 18B:
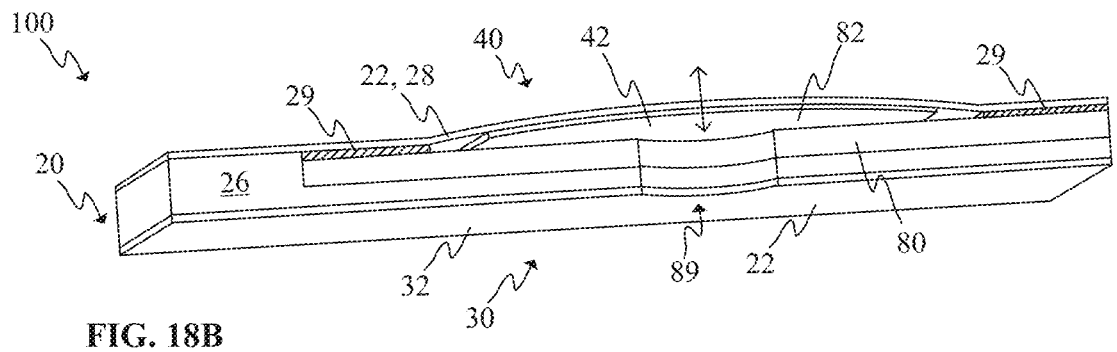

FIGS. 18A and 18B illustrate interface assemblies 100. FIGS. 18A and 18B illustrate an interface assembly 100 as a cross-sectional side view. The interface assembly 100 comprises a movable member 40 which is defined by a portion of the substrate 22, 28, preferably a flexible and/or formable, such as thermoformable, substrate film, and a detection portion 42, preferably being a planar element on the surface of said substrate 22, 28.

The movable member 40 may, thus, be an integrated part of the functional multilayer structure 20, the movable member 40 being still movable relative to the structure 20. In an embodiment, the movable member 40 may, advantageously, comprise a portion of the substrate 22, 28.

In preferable embodiments, the detection portions 42 is a first contact pad or strip or area of electrically conductive material, such as of metal (copper, aluminum, silver, etc., or metal alloy thereof) being provided onto the surface of the substrate 22, 28, preferable formable substrate film. The first contact pad, the first strip or the first area may be used as a capacitive sensing element area.

The detection portion 42 may further be connected to an electrical circuit on the same substrate 22, 28, another substrate, or on another host device etc. The interface assembly 100 also comprises a void or empty space 82 between the substrate 22, 28 and the functional multilayer structure 20, preferably on the corresponding position with the detection portion 42. Thus, when exerting force, such as by pressing onto, the outer surface of the movable member 40, or "dome", the detection portion 42 can move towards the functional multilayer structure 20.

The functional multilayer structure 20 may thus comprise a sensor 32, such as a second contact pad, second strip, or second area of electrically conductive material (copper, aluminum, silver, etc., or metal alloy thereof) being provided onto the surface of the substrate 22, 28, preferable formable substrate film, on the opposite side of the molded material layer 26, being at least partly embedded into or at least covered on one side by the molded material layer 26. The second contact pad, the second strip or the second area may also be used as a capacitive sensing element, that is interacting with the first contact pad, the first strip or the first area to provide a capacitive sensing device, such as including TX (transmitter) and RX (receiver) electrodes in the form of the first and second contact pads or the like.

In preferable embodiments, the first and/or the second contact pads etc. may have been produced by printing them on the corresponding substrate 22, 28. Printing techniques such as to screen printing, flexography, and inkjet printing, being a substantially additive printing processes, may be utilized.

In various embodiments, the functional multilayer structure 20 may also comprise a ventilation channel 89 connecting between the empty space 82 and the surrounding environment of the interface assembly 100, preferably via a channel portion extending through the functional multilayer structure 20. Thus, when moving the movable member 40 towards the structure 20, the pressure inside the empty space may be controlled so as to not increase too much and/or provide too much resistance against said movement.

In some embodiments, the functional multilayer structure 20 may comprise support material layer 80. The surface of the support material layer 80 facing the substrate 22, 28 is preferably such that it does not adhere to the substrate too strongly or at least less strongly than the molded material layer 26.

In further embodiments, such as illustrated in FIG. 18B, there may be an adhesive 29, such as structural adhesive, being electrically insulating, used between the support material layer 80 and the substrate 22, 28 on which the detection portion 42 resides. The adhesive 29 is, preferably, arranged to attach portion(s) of the substrate 22, 28 to the support material layer 80 surrounding the portion defining the movable member 40.

Figure 19A:
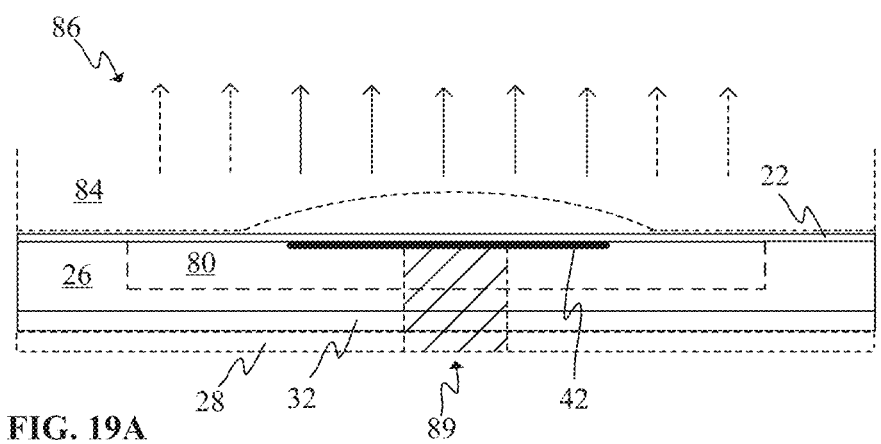
FIGS. 19A, 19B, 19C and 19D illustrate some method steps for manufacturing an interface assembly.

FIGS. 19A-19D illustrate some method steps for manufacturing an interface assembly 100. FIG. 19A illustrate a multilayer structure comprising at least one substrate 22, 28, on surface on which a first contact pad or the like (marked with reference sign 42) has been provided. Furthermore, there may be a molded material layer 26 being molded on a side of the substrate 22, 28, or a molded material layer 26 may be provided after the substrate 22, 28 has been formed to include the shape which then acts as a movable member 40.

In FIG. 19A, the contact pad is arranged on the same side of the substrate 22, 28 as the molded material layer 26, however, the contact pad could alternatively be on the opposite side, that is on the outer surface of the interface assembly 100 which is to be manufactured.

Furthermore, said multilayer structure comprises a second contact pad or the like (marked with reference sign 32), being at least partly embedded into or covered by the molded material layer 26. FIG. 19A shows an optional mold 84 arranged on the structure at the corresponding position with the first contact pad. The mold 84 may be utilized to cause force, such as suction 86 or negative pressure 86, or in some cases high pressure 86 (via the ventilation channel 89, if any), onto the surface of the substrate 22, 28 at the corresponding position relative to the first contact pad, as can be seen. The mold 84 comprises a recess, in this case having a shape of a dome, however, the shape could easily be some other. For example, the shape may instead be longitudinal such as to provide a slider interface.

During the forming process, such as thermoforming process utilizing elevated temperature and pressure (such as related to room temperature and ambient temperature), the substrate 22, 28 detaches from the structure below, if any, such as relative to the molded material layer 26 or the support material layer 80, so that a void or empty space 82 is produced between the first contact pad, that is the detection portion 42, and the multilayer structure, that is the functional multilayer structure 20.

Figure 19B:
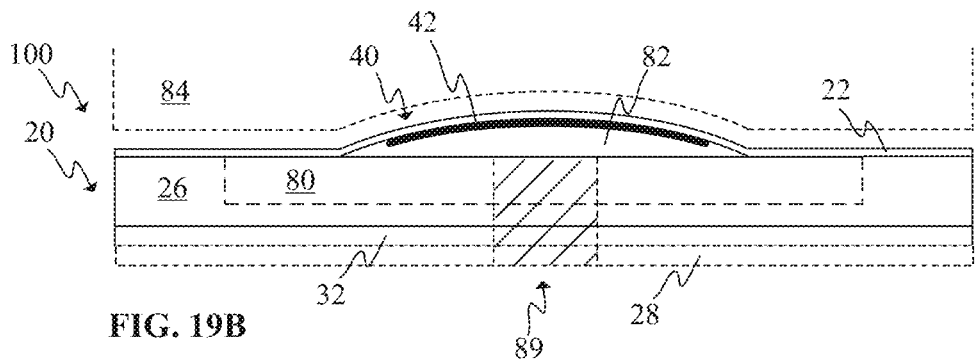
Figure 19C:
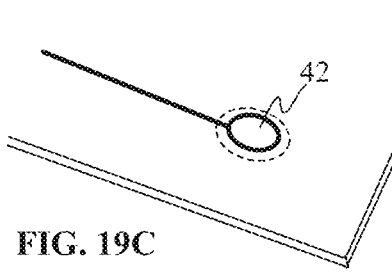
Figure 19D:
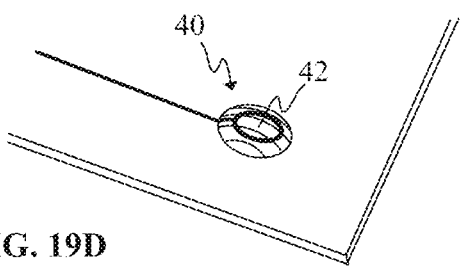

FIGS. 19C and 19D illustrates substantially similar steps as FIGS. 19A and 19B, however, from a perspective view. In FIG. 19C, the substrate 22, 28 is in contact with the structure below, and basically planar-shaped, at least locally at the first contact pad. Then, in FIG. 19D, once the substrate 22, 28 has been formed, such as thermoformed, at least locally at the first contact pad, there is a dome-shaped movable member 40 and a void or empty space 82 under the movable member 40 so as to allow it to move. There is an advantage that while detection portion 42 moves inside that empty space 82, which is optionally ventilated (ventilation channel 89) relative to the ambient pressure, the sensor 32, such as capacitive sensing element or electrode, can be embedded in the molded material layer 26, or between the molded material layer 26 and another substrate 28, thus essentially sealing it from ambient conditions (humidity, temperature, pressure, etc).

The first substrate 22 and/or the second substrate 28, such as substrate film(s), or generally material layer(s) included in the multilayer structure 20 may comprise at least one material selected from the group consisting of: polymer, thermoplastic material, electrically insulating material, Polymethyl methacrylate (PMMA), Poly Carbonate (PC), flame retardant (FR) PC film, FR700 type PC, copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

The molded material layer 26 may, in general, comprise, for example, at least one material selected from the group consisting of: polymer, organic material, biomaterial, composite material, thermoplastic material, thermosetting material, elastomeric resin, PC, PMMA, ABS, PET, copolyester, copolyester resin, nylon or polyamide (PA), polypropylene (PP), thermoplastic polyurethane (TPU), polystyrene (GPPS), TPSiV (thermoplastic silicone vulcanizate), and MS resin. The molded material layer may be transparent, translucent, or opaque.

In various embodiments, (one or both of) the substrate(s) 22, 28 may be a printed circuit board (PCB), a ceramic substrate, a flexible printed circuit, FR-4 substrate or the like. Even metal substrates may be used in various embodiments. The metal substrate may or may not comprise insulating coating on one or both larger surfaces thereof.

Depending on the embodiment in question, the substrate(s) 22, 28 and/or further film(s) or layers potentially included in the structure 20 may comprise or be of optically substantially transparent or at least translucent material(s) having regard to the wavelengths of interest, such as visible light, with associated optical transmittance of about 80%, 90%, 95%, or more, for example. This may be the case especially when the substrate is configured in the structure 20 so as to effectively convey or pass light emitted by a light source. Yet, in some embodiments the used substrate 22, 28 could be substantially opaque, black and/or otherwise exhibitive of dark color, to block incident light from passing through it (mask function).

In case of the substrate 22, 28 being a substrate film, the thickness of the film and optionally of further film(s) or layer(s) included in the structure 20 may vary depending on the embodiment; it may only be of few tens or hundreds of a millimeter, or considerably thicker, in the magnitude of one or few millimeter(s), for example.

The thickness may indeed locally vary and/or may optionally comprise recesses or internal cavities for light guiding, processing, and/or thermal management purposes, for instance, in addition to accommodating various elements such as electronic or optical elements.

The substrate film as well as further layers such as films, coatings, etc. of the structure may be essentially planar (width and length greater, e.g., different in the order of magnitude, than the thickness). The same generally applies also to the overall structure as illustrated in the figs even though also other, non-planar shapes are fully feasible.

In various embodiments, possible additional layers or generally features, may have been added into the multilayer structure 20 by molding, lamination or suitable coating (e.g. deposition) procedure not forgetting other possible positioning or fixing techniques. The layers may be of protective, indicative and/or aesthetic value (graphics, colors, figures, text, numeric data, etc.) and contain e.g. textile, leather or rubber materials instead of or in addition to further plastics. Additional elements such as electronics, modules, module internals or parts, and/or optics may be installed and fixed e.g. at the outer surface(s) of the structure, such as the exterior surface of an included film or a molded material layer depending on the embodiment. Necessary material shaping/cutting may take place. For example, a diffuser may be produced from locally lasering lightguide material. If provided with a connector, the connector of the multilayer structure 20 may be connected to a desired external connecting element such as an external connector of an external device, system or structure, e.g. a host device. For example, these two connectors may together form a plug-and-socket type connection and interface. The multilayer structure 20 may also be generally positioned and attached herein to a larger ensemble such as an electronic device such as a personal communications device, computer, household apparatus, industrial device, or e.g. a vehicle in embodiments wherein the multilayer structure establishes a part of vehicle exterior or interior, such as a dashboard.

Furthermore, the structure 20 may comprise electrical circuit, e.g. on a substrate 22, 28, that comprises at least one component or element selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, and electronic sub-assembly. In various embodiments, the circuitry may be embedded in the molded material layer 26, at least partly.

Figure 20:
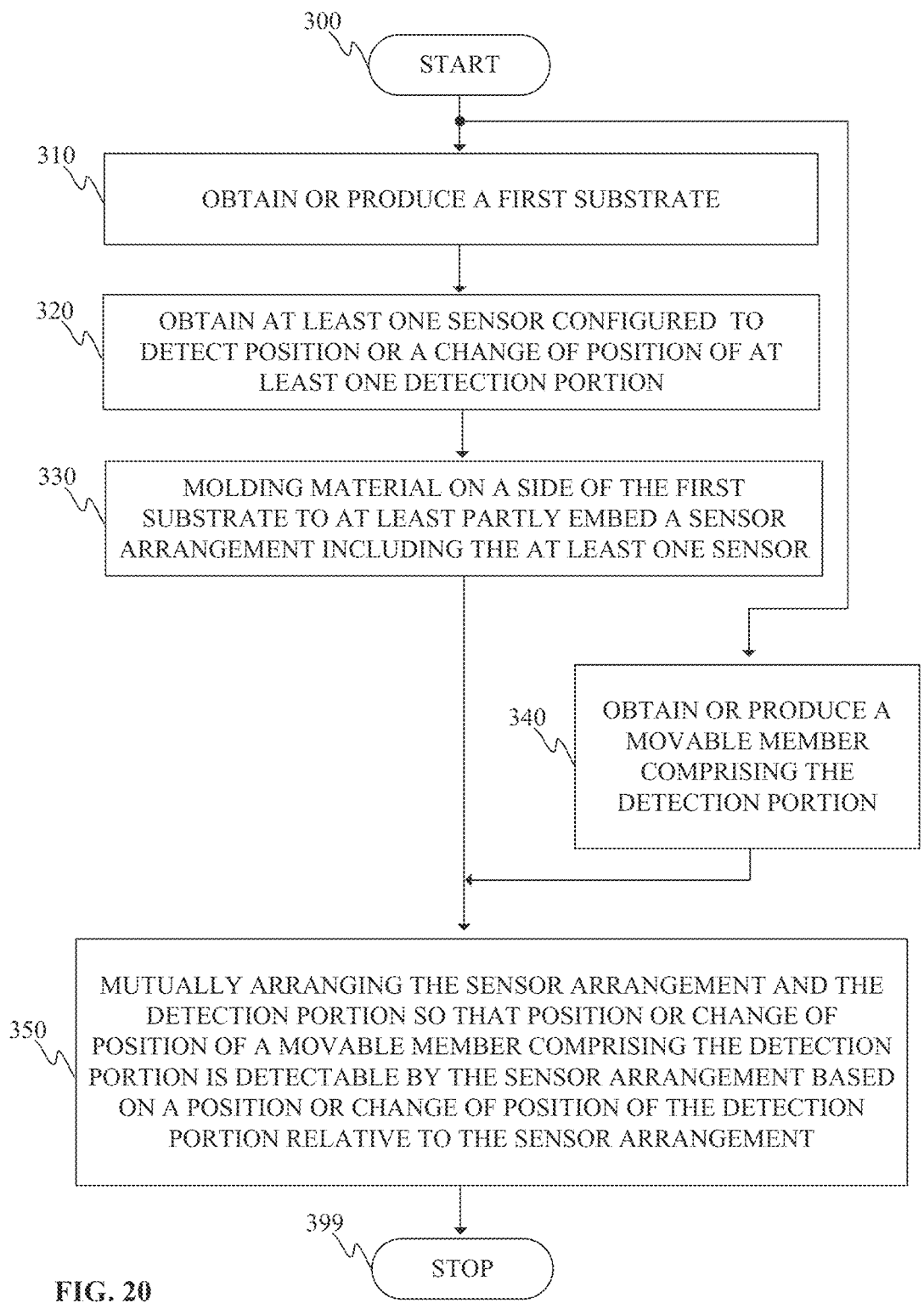
FIG. 20 shows a flow diagram of a method for manufacturing an interface assembly.

FIG. 20 shows a flow diagram of a method for manufacturing an interface assembly 100.

Step or item 300 refers to a start-up phase of the method. Suitable equipment and components are obtained and systems assembled and configured for operation.

At the beginning of the method, a start-up phase 300 may be executed. During start-up, the necessary tasks such as material, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding, IMD (in-mold decoration), lamination, bonding, (thermo)forming, electronics assembly, cutting, drilling, printing and/or measurement such as desired optical measurements-providing equipment, among others, may be thus ramped up to operational status at this stage.

Step or item 310 refers to obtaining or producing a first substrate 22, 28 (such as first substrate 22 and/or a second substrate 28), such as a thermoformable, preferably flexible, substrate film. The substrate 22, 28 may be ready-made substrate or substrate film, preferably a planar substrate (film), including a substrate film on a roll. The substrate 22, 28 may at least dominantly be of electrically substantially insulating material(s). In some embodiments the substrate 22, 28, being a substrate film, itself may be first produced in-house by molding using a mold or molding device or other methods from selected starting material(s). Optionally, the substrate film may be processed further at this stage. It may be, for example, provided with holes, notches, recesses, cuts, etc.

Step or item 320 refers to obtaining at least one sensor 32 configured to detect position or a change of position of at least one detection portion 42.

In various embodiments, a number of electrically and/or thermally conductive elements defining e.g. various conductor lines (traces), sensing elements such as electrodes, and/or contact areas such as pads to construct a electrical circuit design are provided on one or more of the substrate(s), or advantageously substrate film(s), either or both sides thereof, preferably by one or more additive techniques of e.g., printed electronics technology or 3D printing. For example, screen, inkjet, flexographic, gravure or offset lithographic printing may be applied by suitable printing device or devices. In some cases, also subtractive or semi-additive processes may be utilized. Further actions cultivating the substrate film(s) involving e.g. printing or generally provision of graphics, visual indicators, optical elements, etc. thereon may take place here.

In various embodiments the electrically and/or thermally conductive elements (traces, pads, connection elements, electrodes, etc.) may include at least one material selected from the group consisting of: conductive ink, conductive nanoparticle ink, copper, steel, iron, tin, aluminum, silver, gold, platinum, conductive adhesive, carbon fiber, graphene, alloy, silver alloy, zinc, brass, titanium, solder, and any component thereof. The used conductive materials may be optically opaque, translucent and/or transparent at desired wavelengths, such as at least portion of visible light, so as to mask or let the radiation such as visible light to be reflected therefrom, absorbed therein or let through, for instance. As practical examples of feasible conductive material, e.g. Dupont™ ME602 or ME603 conductive ink may be utilized.

At least part of the electronics and/or other elements of the final multilayer structure may be conveniently provided to the substrate(s) 22, 28, such as substrate film(s), via a fully or partially pre-manufactured module or sub-assembly. Optionally, the module or sub-assembly may be at least partially overmolded by a protective plastic layer prior to attachment to the substrate 22, 28.

For example, adhesive, pressure and/or heat may be used for mechanical bonding of the module or sub-assembly with the primary (host) substrate. Solder, wiring, and conductive ink are examples of applicable options for providing the electrical and/or thermal connections between the elements of the module or sub-assembly and with the remaining electrical and/or thermal elements on the main substrate.

Step or item 330 refers to molding material on one side of the first substrate 22, 28 to at least partly embed a sensor arrangement 30 including the at least one sensor 32 into a molded material layer 26, thereby obtaining a functional multilayer structure 20.

Step or item 340 refers to obtaining or producing a movable member 40 comprising the at least one detection portion 42. It should be noted that the obtaining or producing the movable member 40 may be performed at any stage relative to the other phases of the method. For example, the movable member 40 may be produced or obtained before obtaining the substrate(s) 22, 28. In some embodiments, as described hereinbefore in connection with FIGS. 18A-19D, the movable member 40 may be produced during an optional step of thermoforming (described hereinafter) the substrate 22, 28, preferably a substrate film. One further example is that the movable member 40 is produced or obtained after the multilayer structure 20 has been manufactured. In FIG. 20, item 340 has thus been drawn as having a parallel branch in the flow diagram.

Step or item 350 refers to mutually arranging the sensor arrangement 30 and the at least one detection portion 42 so that position or a change of position of the movable member 40 is detectable by the sensor arrangement 30 based on a position or a change of position of the at least one detection portion 42 relative to the sensor arrangement 30.

Method execution may be stopped at step or item 399.

Furthermore, the method may comprise thermoforming the first substrate 22, 28 to have at least a portion with a non-planar 3D shape prior the molding 330. Preferably, the thermoforming includes stretching the first substrate 22, 28 at least locally under elevated pressure to produce the non-planar 3D shape. The thermoforming is, preferably, performed after the provision of any conductive traces and electrical circuits, such as including the sensor(s) 32; 32A, 32B, and other electronics components, but before the step of molding 330.

In some embodiments, the groove, the hole, or the through-hole, or, alternatively, the protrusion, the pin or said other shape extending outwards from the surface of the multilayer structure 20 may be provided by thermoforming the substrate 28.

Alternatively or in addition, the method comprises attaching the movable member 40 and the functional multilayer structure 20 to each other in a movable manner.

Furthermore, in various embodiments, the movable member 40 and the functional multilayer structure 20 are mutually adapted so that there is a shape interlocking arrangement therebetween, such as between a portion of the groove, the hole, or the through-hole of the structure 20, and the movable member 40 so as to prevent or at least hinder detachment of the movable member 40 with respect to the functional multilayer structure 20. One example of the shape interlocking arrangement is shown in FIG. 6 and described in connection thereto. As understood by a skilled person in the art, the shape interlocking arrangement may be provided in a plurality of different ways when it comes to details, such as shapes etc., thereof.

Regarding still the molded material layer 26, the optical transmittance of e.g., translucent material selected for the molded material layer 26 may be between about 25% and about 90%, or more, at selected wavelengths such as at least part of the visible wavelengths, considering e.g., about 2 mm or 3 mm thick sample of the material. The associated half power angle can be between about 5 and about 75 degrees (intensity based), such as about 5, 10, 20, 30, 40, 50, 60, or 70 degrees. In different use scenarios, desired transmittance and scattering characteristics may naturally still vary.

Accordingly, the molded material layer 26 may comprise optically at least translucent, optionally substantially transparent, material, wherein the optical transmittance of the overall thermoplastic layer may in some use scenarios preferably be at least 50%, but the desired transmittance may indeed radically differ between all possible use scenarios. In some embodiments at least about 80% or 90% transmittance could be preferred for maximizing the light output from the structure, while in some others 10%, 20% or 30% could be quite sufficient if not even advantageous, if e.g. light leakage related issues are to be minimized. The transmittance may be measured or defined in a selected direction, e.g. main direction of light propagation and/or in a transverse direction to the surface of the substrate film at the position of the lighting module on the substrate film, having regard to selected wavelengths, optionally including visible wavelengths, of the light emitted by at least one light source.

Considering e.g. scattering/diffusion or other optical properties, the molded material layer 26 may generally comprise, for example, at least one material selected from the group consisting of: polymer, organic material, biomaterial, composite material, thermoplastic material, thermosetting material, elastomeric resin, PC, PMMA, ABS, PET, copolyester, copolyester resin, nylon (PA, polyamide), polypropylene (PP), thermoplastic polyurethane (TPU), polystyrene (GPPS), thermoplastic silicone vulcanizate (TPSiV), and MS resin.

One example of a polycarbonate based applicable material is Makrolon™ available in a variety of grades, exhibiting different colors/tinting (e.g. white/whitish and black/blackish or dark), transparencies and scattering characteristics, for example.

In various embodiments, the assembly 100 may also comprise one or several electrical circuits in connection with the sensing arrangement 30 and/or the movable member 40. The electrical circuit(s) may comprise a number of light source(s) and e.g. related drivers, electrically conductive traces or contact pads, optionally printed, on substrate 22, 28 and/or other material layers of the assembly 100 using printed electronics technology. The traces may be configured for power and/or data (e.g. signaling data or other data) transfer between elements such as a light source and related driver, or generally a controller and/or power source, for example. Yet, the circuits may comprise one or more electrodes, electrical connectors, electronic components and/or integrated circuits (IC), such as control circuits or data transfer circuits. Such circuitry may be directly produced in or for the assembly 100 by selected method(s) such as a selected printed electronics technology, optionally screen printing, or using a selected coating technique, for instance. Additionally or alternatively, the circuits may include a number of mounted components such as surface-mounted devices (SMD). Accordingly, non-conductive and/or conductive adhesive may be utilized for securing the components on the carrier. In some embodiments, mechanical securing is implemented or at least enhanced by non-conductive adhesive material whereas solder or other electrically highly conductive (but to lesser extend, adhesive type of) material is used for electrical connection.

If optionally capacitive sensing of e.g., a further touchless gestures upon the assembly 100 is to be implemented, sensing electrodes of the circuits may be configured (dimensioned, positioned, etc.) so that their sensing area or volume defined by e.g., the associated electric or electromagnetic field is located as desired and thereby covers e.g. the area upon selected side walls and/or top of the structure, and/or other regions that should be made sensitive to touch (and/or touchless gestures in some embodiments) or other sensing target. This type of configuring may be achieved or performed through the utilization of necessary simulation or measurements, for instance.

Still, the circuits may comprise and/or the multilayer structure 20 may comprise at least one component or element selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, and electronic sub-assembly.

The assembly 100 may be and in many use scenarios will be connected to an external system or device such as a host device or host arrangement of the assembly 100, wherein the connection may be implemented by a connector, e.g. electrical connector, or connector cable, which may be attached to the assembly 100, or the structure 20, and its elements such as circuits in a selected fashion, e.g. communications and/or power supply wise. The attachment point may be on a side or bottom of the structure, provided e.g., via a through-hole in the substrate 22, 28.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. A method for manufacturing an interface assembly, the method comprising:
    obtaining or producing a first substrate, such as a thermoformable substrate film;
    obtaining at least one sensor configured to detect position or a change of position of at least one detection portion;
    molding material on one side of the first substrate to at least partly embed a sensor arrangement including the at least one sensor into a molded material layer, thereby obtaining a functional multilayer structure;
    obtaining or producing a movable member comprising the at least one detection portion; and
    mutually arranging the sensor arrangement and the at least one detection portion so that position or a change of position of the movable member is detectable by the sensor arrangement based on a position or a change of position of the at least one detection portion relative to the sensor arrangement.

2. The method of claim 1, further comprising thermoforming the first substrate to have at least a portion with a non-planar 3D shape prior the molding.

3. The method of claim 2, wherein the thermoforming includes stretching the first substrate at least locally under elevated pressure to produce the non-planar 3D shape.

4. The method of claim 1, further comprising attaching the movable member and the functional multilayer structure to each other in a movable manner.

5. The method of claim 1, further comprising providing a groove, a hole, or a through-hole; or a protrusion, a pin or other shape extending outwards from a surface of the functional multilayer structure during the thermoforming.

\* \* \* \* \*